United States Patent
Lee et al.

(10) Patent No.: US 7,972,980 B2
(45) Date of Patent: *Jul. 5, 2011

(54) METHOD OF FORMING CONFORMAL DIELECTRIC FILM HAVING SI-N BONDS BY PECVD

(75) Inventors: Woo Jin Lee, Tama (JP); Akira Shimizu, Sagamihara (JP)

(73) Assignee: ASM Japan K.K., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/778,808

(22) Filed: May 12, 2010

(65) Prior Publication Data

US 2010/0221925 A1 Sep. 2, 2010

Related U.S. Application Data

(63) Continuation-in-part of application No. 12/357,174, filed on Jan. 21, 2009, now Pat. No. 7,919,416, and a continuation-in-part of application No. 12/553,759, filed on Sep. 3, 2009.

(51) Int. Cl.
*H01L 21/469* (2006.01)

(52) U.S. Cl. ........ 438/792; 438/723; 438/712; 438/710; 438/711; 438/763; 257/324; 257/632; 257/E21.266; 257/E21.487; 257/E29.165

(58) Field of Classification Search .................. 438/792, 438/791, 723, 712, 710; 257/E21.487
See application file for complete search history.

(56) References Cited

U.S. PATENT DOCUMENTS

| | | | |
|---|---|---|---|
| 5,801,104 A | 9/1998 | Schuegraf et al. | |
| 6,017,779 A | 1/2000 | Miyasaka | |
| 6,974,781 B2 | 12/2005 | Timmermans et al. | |
| 7,092,287 B2 | 8/2006 | Beulens et al. | |
| 7,294,582 B2 | 11/2007 | Haverkort et al. | |
| 7,297,641 B2 | 11/2007 | Todd et al. | |
| 2005/0181535 A1 | 8/2005 | Yun et al. | |
| 2006/0019502 A1 | 1/2006 | Park et al. | |
| 2006/0199357 A1* | 9/2006 | Wan et al. | 438/482 |
| 2007/0166999 A1 | 7/2007 | Vaartstra | |
| 2007/0251444 A1 | 11/2007 | Gros-Jean et al. | |
| 2008/0003838 A1 | 1/2008 | Haukka | |
| 2008/0242116 A1 | 10/2008 | Clark | |
| 2008/0317972 A1 | 12/2008 | Hendriks | |
| 2009/0311857 A1* | 12/2009 | Todd et al. | 438/591 |
| 2010/0124621 A1* | 5/2010 | Kobayashi et al. | 427/579 |
| 2010/0144162 A1* | 6/2010 | Lee et al. | 438/791 |
| 2010/0184302 A1* | 7/2010 | Lee et al. | 438/792 |

OTHER PUBLICATIONS

Non-Final Office Action for U.S. Appl. No. 12/553,759 dated Dec. 15, 2010.

(Continued)

*Primary Examiner* — Matthew Smith
*Assistant Examiner* — Wilner Jean Baptiste
(74) *Attorney, Agent, or Firm* — Snell & Wilmer L.L.P.

(57) ABSTRACT

A method of forming a conformal dielectric film having Si—N bonds on a semiconductor substrate by plasma enhanced chemical vapor deposition (PECVD) includes: introducing a nitrogen- and hydrogen-containing reactive gas and a rare gas into a reaction space inside which a semiconductor substrate is placed; applying RF power to the reaction space; and introducing a hydrogen-containing silicon precursor as a first precursor and a hydrocarbon gas as a second precursor in pulses into the reaction space wherein a plasma is excited, thereby forming a conformal dielectric film doped with carbon and having Si—N bonds on the substrate.

20 Claims, 17 Drawing Sheets

OTHER PUBLICATIONS

Notice of Allowance for U.S. Appl. No. 12/357,174 dated Dec. 13, 2010.
Final Office Action for U.S. Appl. No. 12/357,174 dated Sep. 1, 2010.
Non-Final Office Action for U.S. Appl. No. 12/357,174, dated Apr. 1, 2010.

* cited by examiner

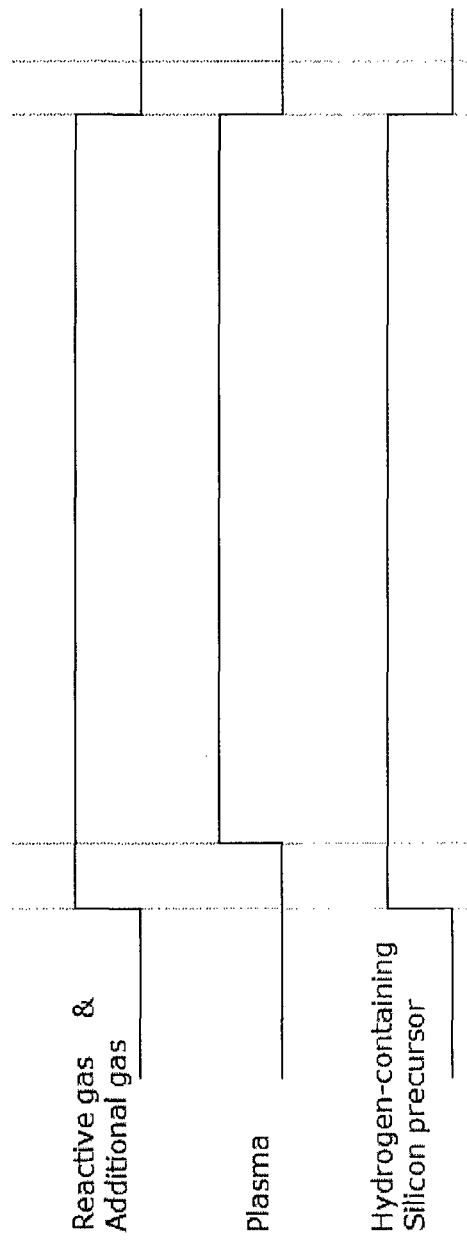
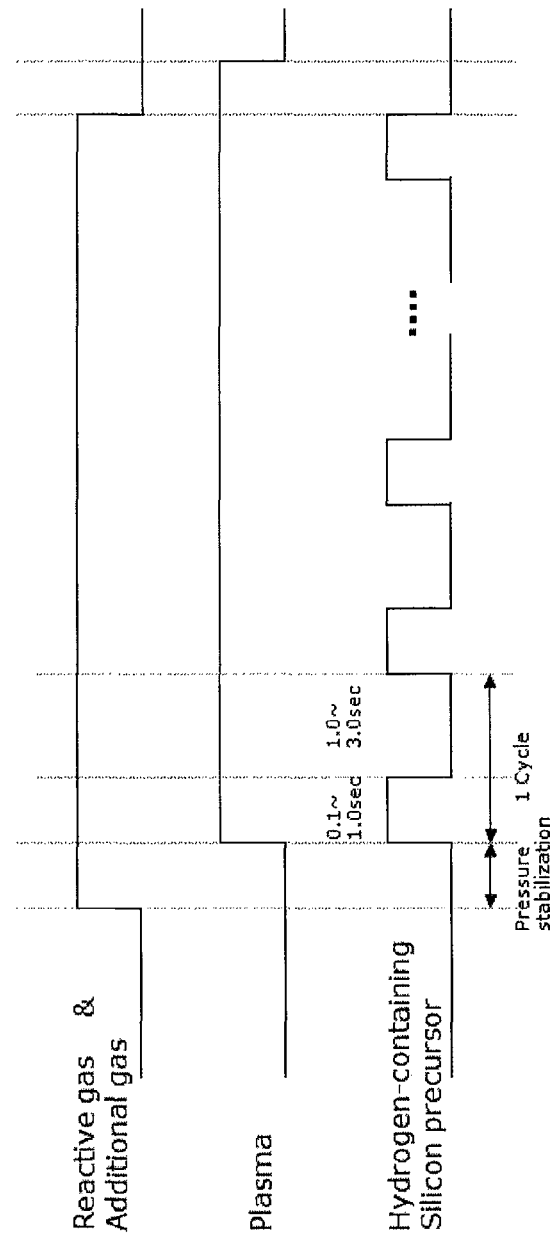
Fig. 2a
Fig. 2b

METHOD OF FORMING CONFORMAL DIELECTRIC FILM HAVING SI-N BONDS BY PECVD

CROSS-REFERENCE TO RELATED APPLICATIONS

This application is a continuation-in-part of U.S. patent application Ser. No. 12/357,174, filed Jan. 21, 2009, and No. 12/553,759, filed Sep. 3, 2009, the disclosure of each of which is herein incorporated by reference in its entirety.

BACKGROUND

1. Field of the Invention

The present invention relates to semiconductor integrated circuit manufacturing and, more particularly to a method of forming a conformal dielectric film such as a silicon nitride film and also a method for modifying etch properties of the dielectric films using an additive precursor by modified plasma enhanced chemical vapor deposition (PECVD) at low temperatures.

2. Description of the Related Art

In integrated circuits fabricated on semiconductor substrates for large scale integration require multiple levels of metal interconnections to electrically interconnect discrete layers of semiconductor devices formed on semiconductor chips. The different levels of interconnections are separated by various insulating or dielectric layers, which are etched to form via holes so as to connect one level of metal to another.

The evolution of chip design continually requires faster circuitry and greater circuit density than before. For faster circuits with greater circuit densities, certain properties are required of materials used to fabricate such integrated circuits, particularly as the dimensions of integrated circuit components are reduced to the sub-micron scale. Also, for greater integrated circuit densities, certain process sequences are required for the manufacture of integrated circuit components.

In recent years, silicon nitride layers deposited at low temperatures (less than 400° C.) have been used in a number of important applications for memory devices, for example, as a passivation layer, a surface protection layer and/or a spacer for a transistor gate. Silicon nitride films may be formed by a plasma enhanced chemical vapor deposition (PECVD) method. The main advantages of the PECVD method over other CVD methods are higher deposition rates, and the controllability of over a wide range of refractive indices. A further advantage of the PECVD method is that the process can take place at a relatively low temperature, for example temperatures under 400° C., keeping the total thermal budget of the cell processing to a minimum.

However, the PECVD method for forming silicon nitride leads to poor conformality or poor step coverage on a substrate containing small and/or high aspect ratio features. In small circuits and devices, such as ultra-large scale integrated (ULSI) circuitry, poor conformal coverage can hamper the development of higher density circuit devices and elements.

In recent years, atomic layer deposition (ALD) has been investigated to improve conformality or step coverage of silicon nitride films on a substrate containing small features. However, the ALD method for forming silicon nitride leads to extremely poor deposition rates. Such poor deposition rates hamper the manufacturing cost down for development of higher density circuit devices and elements.

SUMMARY

An object of at least one embodiment of the present invention is to provide a method of forming a hydrogen-containing conformal layer having Si—N bonds, such as a silicon nitride layer, on surfaces of trenches for an integrated circuit at low temperatures, for example temperatures below 400° C.

Another object of at least one embodiment of the present invention is to provide a method for modifying etch properties of the deposited layers, such as wet etching rates, by adding a second precursor while maintaining high deposition rates and high conformality. In some embodiments, the conformal dielectric film is a carbon-doped silicon nitride having a carbon concentration of at least about 5% (e.g., 20% to 40%) and having a dielectric constant of about 7 or lower (e.g., 5.5 to 7).

In some embodiments of the invention, a method of forming a conformal dielectric film having Si—N bonds on a semiconductor substrate by plasma enhanced chemical gas deposition (PECVD) is provided. The method includes introducing a nitrogen- and/or hydrogen-containing reactive gas and a rare gas into a reaction space inside which the semiconductor substrate is placed, RF power is applied to the reaction space. In some embodiments, a hydrogen-containing silicon gas is introduced as a first precursor and a hydrocarbon gas is introduced as a second precursor, each precursor being introduced in pulses of less than 5-second duration into the reaction space while introducing the reactive gas and the rare gas without interruption, wherein a plasma is excited, thereby forming a conformal dielectric film having Si—N bonds on the substrate. In this disclosure, the "gas" includes vaporized solid and/or liquid, and may be comprised of a mixture of gases.

In another embodiment, a method of forming a hydrogen-containing highly conformal layer having Si—N bonds on a semiconductor substrate by plasma enhanced chemical vapor deposition (PECVD), comprises; introducing a reactive gas and an additive gas into a CVD reaction chamber inside which a semiconductor substrate is placed wherein the semiconductor substrate temperature is maintained in the range of approximately 0° C. to approximately 400° C. After the reactive and additive gases are introduced into the reaction chamber, a plasma exciting condition is provided in the reaction chamber. A hydrogen-containing silicon precursor is introduced into the reaction chamber in pulses using a pulse flow control valve, wherein the silicon precursor is introduced into the reaction chamber where the plasma is excited, thereby forming a hydrogen-containing conformal film having Si—N bonds on the substrate by plasma reaction of the gases.

In an embodiment, the substrate is maintained at a temperature of about 0° C. to 400° C. A hydrogen-containing silicon precursor may be composed of: a combination of silicon and hydrogen; a combination of silicon, hydrogen, and nitrogen; or a combination of silicon, hydrogen, carbon, and nitrogen. In an embodiment, the vaporized hydrogen-containing silicon precursor may be introduced in pulses of a duration of approximately 0.1 sec to approximately 1.0 sec at with an interval between pulses of approximately 0.5 sec to approximately 3 sec while maintaining plasma polymerization. In an embodiment, the reaction gas may be a combination of nitrogen gas and hydrogen gas or a combination of ammonia gas and hydrogen gas. In an embodiment, the additive gas may be selected from the group consisting of He, Ar, Kr, Xe, and the molar flow rate of the additive gas may be greater than the molar flow rate of the hydrogen-containing silicon source. In an embodiment, the reaction chamber may be maintained at a pressure of about 0.1 Torr to about 10 Torr. In an embodiment, RF power may be between approximately 0.02 W/cm² and approximately 20 W/cm². After being introduced into the chamber, the reactive gas reacts with the hydrogen-containing silicon precursor supplied in pulses by plasma reaction so as to form a conformal film having Si—N bonds on a substrate surface.

In an embodiment, the hydrogen-containing silicon gas may have no carbon atom in its molecule and may constitute a first precursor, and the precursor may further comprise a hydrocarbon-containing gas as a second precursor. By adding the second precursor, the wet etching rate of the resultant film, for example, can significantly be improved or manipulated.

In the above, the first precursor and the second precursor may be distinguished based on whether it contains carbon. The reactive gas may be defined as a gas having no hydrocarbon and no silicon. In the above, there is no overlap between the first and second precursors and the reactive gas as types of gases. In an embodiment, the first precursor and the second precursor may be introduced in pulses at the same timing. In an embodiment, the pulse duration of the second precursor may be different from that of the first precursor.

In some embodiments, the first precursor and the second precursor are introduced in pulses having the same cycle. In some embodiments, the pulse duration of the second precursor is equal to or more than one to ten times longer than that of the first precursor.

In some embodiments, the first precursor and the second precursor are introduced in pulses having different cycles, wherein more than one cycle of the second precursor is performed per one cycle of the first precursor.

In some embodiments, the second precursor is at least one gas selected from the group consisting of $CH_4$, $C_2H_6$, $C_5H_{12}$, and $C_6H_{14}$. The second precursor may have no silane from the point of view that it is not easy to control the carbon concentration of the resultant conformal dielectric film by using a precursor containing silane as compared with using a precursor of hydrocarbon containing no silane. In some embodiments, the first precursor is at least one gas selected from the group consisting of carbon-free silane compounds such as silane, disilane, and trisilylamine, and carbon-containing silane compounds such as tetramethyldisilazane, hexamethyldisilazane, dis-diethylaminosilane, and dis-ethylmethylaminosilane.

In some embodiments, the gases introduced into the reaction space consist of the first precursor, the second precursor, the reactive gas, and the rare gas.

In some embodiments, the method further comprise, after forming the conformal dielectric film as a first conformal dielectric film, increasing the pulse duration of the second precursor per cycle without changing the length of one cycle which is the same as that for the first precursor, or performing multiple cycles of the second precursor per one cycle of the first precursor, thereby forming a second conformal dielectric film which has a carbon concentration higher than that of the first conformal dielectric film.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purpose and are not necessarily to scale.

FIGS. 2a and 2b show process steps of a comparative PECVD method and those of an embodiment related to the present invention for depositing a silicon nitride film, respectively.

DETAILED DESCRIPTION

Figure 1:
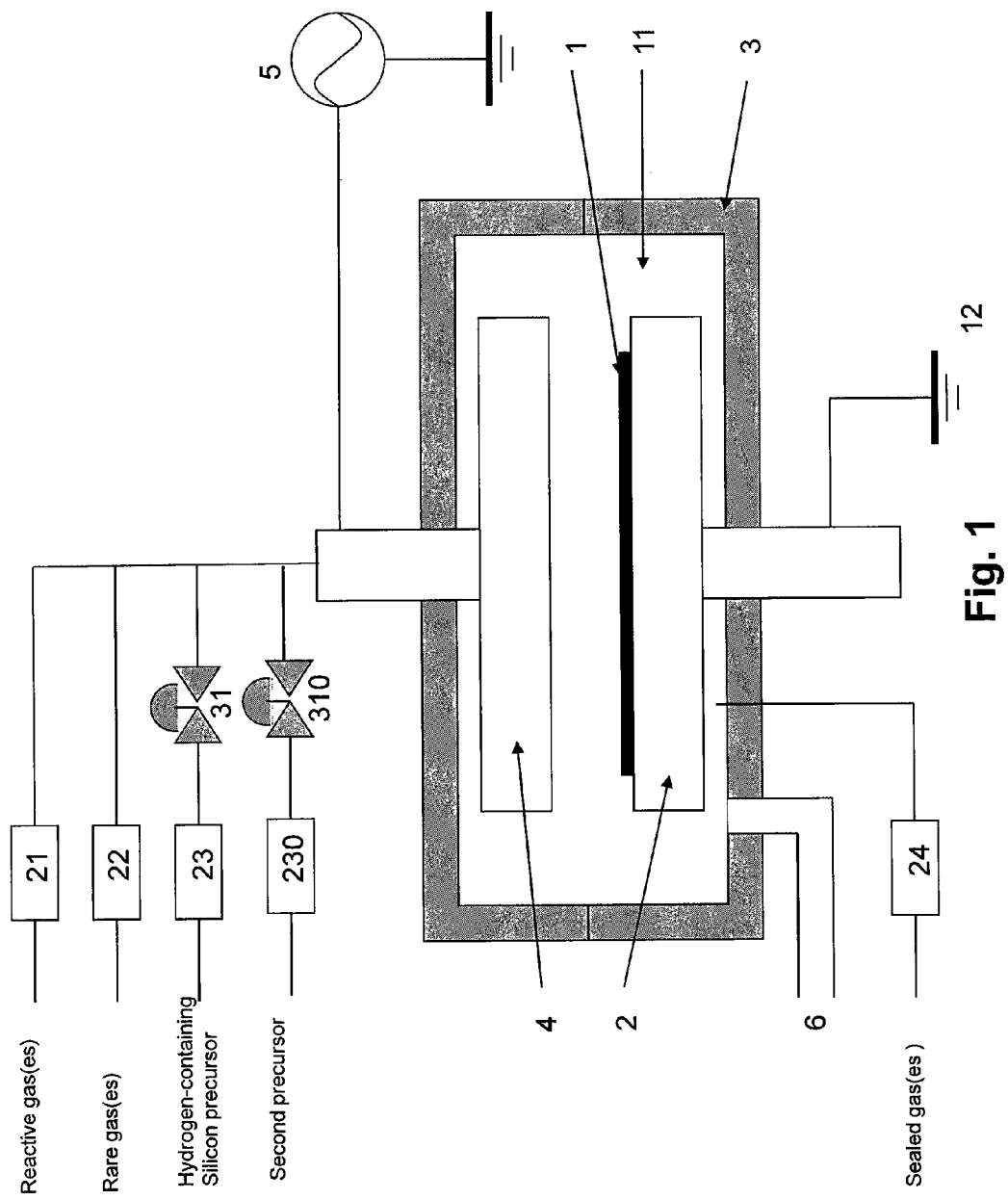
FIG. 1 is a schematic representation of a PECVD apparatus for depositing a silicon nitride film according to one embodiment of the present invention.

The present invention is described with reference to embodiments which are not intended to limit the present invention. Additionally, an element applied in an embodiment may freely be applicable to other embodiments, and elements applied in different embodiments may mutually be replaceable or interchangeable unless special conditions are attached thereto. Further, the ranges indicated below may include or exclude the endpoints in embodiments.

An embodiment provides a method of forming a conformal dielectric film having Si—N bonds on a semiconductor substrate by plasma enhanced chemical vapor deposition (PECVD), which comprises: (a) introducing a nitrogen- and/or hydrogen-containing reactive gas and a rare gas into a reaction space inside which a semiconductor substrate is placed; (b) applying RF power to the reaction space; and (c) introducing a hydrogen-containing silicon gas as a first precursor and a hydrocarbon gas as a second precursor separately, each precursor being introduced in pulses of less than 5-second duration into the reaction space while introducing the reactive gas and the rare gas without interruption, wherein a plasma is excited, thereby forming a conformal dielectric film having Si—N bonds on the substrate.

In an embodiment, the hydrogen-containing silicon precursor may have a formula of $Si_\alpha H_\beta X_\gamma$, wherein $\alpha$, $\beta$ and $\gamma$ are integers and $\gamma$ includes zero. X can comprise N, F, and/or $C_m H_n$, wherein m and n are integers. In an embodiment, $\alpha$ may be 1 to 5, $\beta$ may be 1 to 10, and $\gamma$ may be 0 to 6. In an embodiment, m may be 2 to 18, and n may be 6 to 30.

In any of the foregoing embodiments, the substrate may be kept at a temperature of 0° C. to 400° C. while the film is deposited thereon. In some embodiments the substrate temperature is about 250° C. to about 350° C. during deposition.

In any of the foregoing embodiments, the hydrogen-containing silicon precursor may be vaporized upstream of the reaction space.

In any of the foregoing embodiments, the hydrogen-containing precursor may be liquid at room temperature.

In any of the foregoing embodiments, the hydrogen-containing silicon precursor may be introduced in pulses while the reactive gas and the additive gas are continuously introduced and the RF power is continuously applied.

In any of the foregoing embodiments, the hydrogen-containing silicon precursor (the first precursor) may be introduced in pulses of a duration of approximately 0.1 sec to 1.0 sec. In some embodiments the pulses of the hydrogen-containing silicon precursor are of a duration of about 0.2 sec to about 0.3 sec. In some embodiment, the second precursor may be introduced in pulses of duration equal to or more than one to ten times longer than that of the first precursor (in some embodiments, four to eight times longer than that of the first precursor).

In some embodiments, the pulses of the hydrogen-containing silicon precursor are separated by intervals of approximately 0.1 sec to 3.0 sec. In some embodiments the intervals are about 0.5 sec to about 3.0 sec or 1.0 sec to about 2.0 sec. In an embodiment, the pulse duration may be equal to or shorter than the interval. In some embodiments, cycles of the first precursor and cycles of the second precursor are synchronized in a one-to-one relation, or in a relation where multiple cycles (e.g., 2 to 10 cycles, or 3 to 6 cycles) of the second precursor are performed per one cycle of the first precursor. By adjusting the pulse duration of the second precursor and/or adjusting the length of one cycle of the second precursor, the carbon content of the resulting conformal dielectric film can be adjusted in a range of about 5% to about 40% (atomic %). If the second precursor is introduced continuously, the carbon content can be higher, but the conformality of the resulting film will be worsened.

In some embodiments, the flow rate of the first precursor may be in a range of 10 sccm to 2000 sccm (preferably 100 sccm to 500 sccm), whereas that of the second precursor may be in a range of 0 sccm to 2000 sccm (preferably 100 sccm to 1500 sccm) when they are being introduced.

In any of the foregoing embodiments, the reactive gas may comprise a mixture of $N_2$ and $H_2$, a mixture of $NH_3$ and $H_2$, and a nitrogen-boron-hydrogen gas. In an embodiment, the reactive gas may comprise a mixture of $N_2$ and $H_2$ with a molar flow rate ratio of $N_2/H_2$ of approximately 1/1 to 10/1. In some embodiments the molar flow rate ratio of $N_2$ and $H_2$ is about 2/1 to about 4/1. In an embodiment, the reactive gas may comprise a mixture of $NH_3$ and $H_2$ with a molar flow rate ratio of $NH_3/H_2$ of approximately 1:1 to 1:10. In some embodiments the molar flow rate ratio of $NH_3/H_2$ is approximately 1:1 to 1:3.

In any of the foregoing embodiments, the additive gas may be one or more gasses selected from the group consisting of He, Ar, Kr, and Xe, and the molar flow rate of the additive gas may be greater than the molar flow rate of the hydrogen-containing silicon source. In an embodiment, a flow rate of the additive gas introduced into the reaction chamber may be approximately 30 sccm to 3000 sccm. In some embodiments the flow rate of the additive gas is about 1500 sccm to about 2500 sccm. In an embodiment, the additive gas may comprise a mixture of helium and argon or a mixture of helium and krypton. In an embodiment, the additive gas may comprise a mixture of helium and argon with a molar flow rate ratio of helium/argon of approximately 3/1 to 20/1. In some embodiments the molar flow rate ratio of helium/argon is about 5/1 to about 15/1 In an embodiment, the additive gas comprises a mixture of helium and krypton with a molar flow rate ratio of helium/krypton of approximately 3/1 to 20/1. In some embodiments the molar flow rate ratio of helium/krypton is about 5/1 to about 15/1.

In some embodiments, only the four types of gas (i.e., the hydrogen-containing silicon precursor, hydrocarbon precursor, reactive gas, and rare gas) may be used, and no other gases such as a carbon dioxide gas may be used.

In any of the foregoing embodiments, the conformal dielectric film may be a carbon-doped silicon nitride film.

In any of the foregoing embodiments, the RF power may be applied in the range of approximately 0.02 W/cm$^2$ to approximately 20 W/cm$^2$ per area of the substrate (e.g., a range of 0.05-10 W/cm$^2$, a range of 1-5 W/cm$^2$, and a range of 0.5-3 W/cm$^2$) and the reaction space pressure may be adjusted in the range of approximately 0.1 Torr to approximately 10 Torr. In some embodiments the pressure in the reaction space may be approximately 2 Torr to 9 Torr.

In any of the foregoing embodiments, pulse durations and intervals of the pulses of introducing each precursor may be such that the conformal dielectric film has a step coverage or conformality of at least 80% (e.g., 80% to 95%). In an embodiment, the pulse durations and intervals of the pulses of introducing each precursor may be such that the conformal dielectric film has an etching rate lower than a standard thermal oxide film, for example when using buffered HF to perform a wet etch. In an embodiment, the pulse durations and intervals between pulses of introducing each precursor may be such that the conformal dielectric film has a leakage current lower than 1.0E-08 A/cm$^2$ at 1 MV. In some embodiments the leakage current is between about 1.0E-08 A/cm$^2$ and about 1.0E-10 A/cm$^2$ at 1 MV.

In any of the foregoing embodiments, the dielectric constant of the conformal dielectric film may be in the range of 4.5 to 7.0. In some embodiments the dielectric constant is about 6.5 to about 7.2.

In any of the foregoing embodiments, the hydrogen-containing silicon precursor may be vapor or liquid at room temperature. In some embodiments the hydrogen-containing silicon precursor may be selected from the group consisting of silane, disilane, trisilylamine, and bis(tert-butylamino)silane.

In some embodiments, a plasma reaction step can be performed using a frequency exceeding 5 MHz. For example, a high RF frequency power of 13.56 MHz, 27 MHz, or 60 MHz can be used. In some embodiments a high RF frequency power can be combined with a low RF power of 5 MHz or less. In some embodiments the ratio of low-frequency power to high-frequency power may be 0 to about 50% or less. In some embodiments the ratio of low-frequency power to high-frequency power is 0 to about 30% or less.

In any of the foregoing embodiments, the hydrogen-containing silicon gas may have no carbon atom in its molecule and may constitute a first precursor, and the precursor may further comprise a hydrocarbon-containing gas as a second precursor. In an embodiment, the first precursor and the second precursor may be introduced in pulses at the same timing. In an embodiment, the pulse duration of the second precursor may be different from that of the first precursor.

In another aspect, an embodiment provides a method of forming dielectric films having Si—N bonds on a semiconductor substrate by plasma enhanced chemical vapor deposition (PECVD), which comprises: (i) introducing a nitrogen- and/or hydrogen-containing reactive gas and an rare gas into a reaction space inside which the semiconductor substrate is placed; (ii) applying RF power to the reaction space; (iii) introducing as a first precursor a hydrogen-containing silicon gas in pulses of less than a 5-second duration into the reaction space while introducing the reactive gas and the inert gas without interruption, wherein a plasma is excited, thereby forming a first dielectric film having Si—N bonds on the substrate; and (iv) forming a second dielectric film having Si—N bonds on the substrate by repeating steps (i) to (iii), wherein step (iii) further comprises introducing a second precursor in pulses while introducing the first precursor in pulses at the same timing, thereby increasing wet etching resistance of the second dielectric film as compared with that of the first dielectric film, said second precursor having more hydrocarbons in its molecule than the first precursor.

In an embodiment, step (iv) may further comprise prolonging the pulse duration of the second precursor relative to that of the first precursor. In an embodiment, step (iv) may further comprise reducing nitrogen gas flow relative to that for the first dielectric film.

In still another aspect, an embodiment provides a method of forming dielectric films having Si—N bonds on a semiconductor substrate by plasma enhanced chemical vapor deposition (PECVD), which comprises: (i) introducing a nitrogen- and/or hydrogen-containing reactive gas and an rare gas into a reaction space inside which the semiconductor substrate is placed; (ii) applying RF power to the reaction space; (iii) introducing a first precursor and a second precursor each in pulses of less than a 5-second duration at the same timing into the reaction space while introducing the reactive gas and the inert gas without interruption, wherein a plasma is excited, thereby forming a first dielectric film having Si—N bonds on the substrate, said first precursor being a hydrogen-containing silicon gas, said second precursor having more hydrocarbons than the first precursor; and (iv) forming a second dielectric film having Si—N bonds on the substrate by repeating steps (i) to (iii), wherein step (iii) further comprises introducing another second precursor in pulses while introducing the first and second precursors in pulses at the same timing, thereby changing wet etching resistance of the second dielectric film as compared with that of the first dielectric film.

In an embodiment, step (iv) may further comprise changing the pulse duration of the another second precursor relative to that of the second precursor. In an embodiment, step (iv) may further comprise changing nitrogen gas flow relative to that for the second dielectric film.

In any of the foregoing embodiments, the substrate may be maintained at a temperature of about 0° C. to 400° C. The Si-containing precursor (the first precursor) may be composed of a combination of silicon and hydrogen, or a combination of silicon, hydrogen, nitrogen and carbon. The second precursor may be composed of a combination of silicon, hydrogen and carbon or a combination of hydrogen and carbon. In an embodiment, the vaporized Si-containing precursor and the vaporized second precursor may be introduced in pulses of duration of approximately 0.1 sec to approximately 1.0 sec with intervals of approximately 0.5 sec to approximately 3 sec while maintaining plasma polymerization. In an embodiment, the reaction gas may be a combination of nitrogen gas and hydrogen gas. In an embodiment, the additive precursor may be $NH_3$ or $C_xH_y$ or hydrocarbon containing silicon precursor, where x and y is integers. In an embodiment, x may be 1 to 8 and y may be 4 to 18. In an embodiment, the reaction chamber may be maintained at a pressure of about 0.1 Torr to about 10 Torr. In an embodiment, RF power may be between approximately 0.01 W/cm$^2$ and approximately 1.0 W/cm$^2$.

Embodiments are explained with reference to the drawings which are not intended to limit the present invention. FIG. 1 is a schematic view of an apparatus combining a plasma CVD reactor and flow control valves, desirably in conjunction with controls programmed to conduct the sequences described below, which can be used in an embodiment of the present invention.

In this example, by providing a pair of electrically conductive flat-plate electrodes 4, 2 in parallel and facing each other in the interior 11 of a reaction chamber 3, applying RF power 5 to one side, and electrically grounding 12 the other side, a plasma is excited between the electrodes. A temperature regulator is provided in a lower stage (which also serves as the lower electrode 2), and a temperature of a substrate 1 placed thereon is kept constant at a given temperature. The upper electrode 4 serves as a shower plate as well, and reaction gas and additive gas are introduced into the reaction chamber 3 through gas flow controllers 21, 22, respectively, and the shower plate. Also the hydrogen-containing silicon precursor is introduced into the reaction chamber 3 through a gas flow controller 23, a pulse flow control valve 31, and the shower plate. The second precursor is introduced into the reaction chamber 3 through a gas flow controller 230, a pulse flow control valve 310, and the shower plate. Additionally, in the reaction chamber 3, an exhaust pipe 6 is provided through which gas in the interior 11 of the reaction chamber 3 is exhausted. Additionally, the reaction chamber is provided with a seal gas flow controller 24 to introduce seal gas into the interior 11 of the reaction chamber 3. A separation plate for separating a reaction zone and a transfer zone in the interior of the reaction chamber is omitted from this schematic figure. The seal gas is not required but is used in some embodiments for aiding in preventing reaction gas from communicating with the lower part of the chamber below the separation plate.

For the pulse flow control valves 31, 310, a pulse supply valve that is used for ALD (atomic layer deposition) can be used in an embodiment.

FIG. 2a shows process steps of a comparative PECVD method and FIG. 2b shows process steps of an embodiment related to the present invention method for depositing a silicon nitride films. The comparative method is carried out as shown in FIG. 2a wherein a main (silicon) precursor, reactive gas and additive gas, is introduced into a reaction chamber inside which a substrate is placed, and a plasma is excited while maintaining the supply of all three types of gas. Consequently, a silicon nitride film can be formed on the substrate by a plasma reaction. Formed silicon nitride films by the comparative PECVD method have poor step coverage that may be caused by the overabundant vapor phase reaction which prevents surface migration of depositing material.

In contrast, in an embodiment related to the present invention, a silicon precursor is introduced into the reaction chamber in pulses of less than 5-second duration, preferably less than 2-second duration, so as to effectively inhibit the overabundant vapor phase reaction, thereby improving step coverage or conformity. For example, the embodiment related to the present invention shown in FIG. 2b introduces a silicon precursor into the reaction chamber through a pulse flow control valve for approximately 0.1 sec to approximately 1.0 sec and then shuts off the pulse flow control valve for approximately 1.0 sec to approximately 3 sec. The introduction of the silicon precursor in pulses is repeated. By doing this, a large amount of hydrogen and nitrogen can be added to the process which is believed to significantly enhance the H*, N* radicals during film growth, resulting in improving surface migration of the deposition material so as to form a highly conformal silicon nitride film on a substrate.

In an embodiment, the average thickness deposited per cycle may be about 0.6 nm/cycle to about 1.0 nm/cycle. The pulse supply of the silicon precursor can be continued until a desired thickness of film is obtained. If the desired thickness of film is 20 nm to 100 nm, about 20 cycles to about 150 cycles (e.g., 40 to 100 cycles) may be conducted.

In some embodiments using a particular single wafer PECVD reactor, if the supply pulse is less than 0.1 sec, the deposition rate may become slow and uniformity of the deposited film may become bad because the amount of supplied precursor is not enough to deposit and grow a uniform film. On the other hand, if the supply pulse is more than 1.0 sec, step coverage may become bad (less than 80%) because of overabundant vapor phase reactions. In an embodiment, for a high step coverage structure, overabundant gas phase reaction should be avoided and surface migration should occur during deposition. The pulse supply sequence of FIG. 2b provides variables that can be tuned to realize the above. In some embodiments, if the interval between pulses is less than 0.1 sec with a supply duration of 0.1-1.0 sec, it also may cause poor step coverage. On the other hand, if the interval between pulses is more than 3.0 sec with a supply duration of 0.1-1.0 sec, the film profile and step coverage may not substantially be affected, but the whole process time becomes too long.

According to embodiments of the present invention, the conformality of film can surprisingly be improved as compared with other silicon nitride deposition processes.

For forming a conformal silicon nitride layer on a semiconductor substrate, deposition conditions in an embodiment may be as follows:
Silane: 10~200 sccm
Hydrogen: 500~2000 sccm
Nitrogen: 1000~2000 sccm
Process helium: 500~3000 sccm
Sealed helium: 500 sccm
Argon: 50~500 sccm
Substrate temperature: 0~400° C.
RF power: 0.02 W/cm$^2$~20 W/cm$^2$
Pressure: 0.1~10 Torr
Silane supply time: 0.5~1 sec supply, 1~3 sec supply stop In some embodiments a step coverage (conformality) of obtained silicon nitride film may be more than 80%, wherein the step coverage is defined as the ratio percent of the average thickness of silicon nitride layer deposited on the sidewalls of a trench to the average thickness of silicon nitride layer on the upper surface of the substrate. Leakage current may be lower than approximately 1.0E-08 A/cm$^2$ at 1 MV charge. Additionally, in another embodiment, the reflective index (n) at 633 nm may be in the range of approximately 1.80~2.60.

Another advantage of a conformal silicon nitride deposition process is compatibility with a liquid hydrogen-containing silicon precursor. The deposition conditions in an embodiment may be as follows:
Trisilylamine: 10~2000 sccm
Hydrogen: 500~2000 sccm
Nitrogen: 500~2000 sccm
Process helium: 0~5000 sccm
Sealed helium: 500 sccm
Argon: 50~500 sccm
Substrate temperature: 0~400° C.
RF power: 0.02 W/cm$^2$~20 W/cm$^2$
Pressure: 0.1~10 Torr
Trisilylamine supply time: 0.1~0.5 sec supply, 0.1~2 sec supply stop The silicon nitride layer according to embodiments of the present invention may have conformality of more than about 80%, or more than about 90%. Leakage current may be lower than about 1.0E-08 A/cm$^2$ at a 1 MV charge. Additionally, in another embodiment, the dielectric constant may be about 6.7 to about 7.3. In some embodiments the reflective index (n) at 633 nm may be in the range of about 1.80 to about 2.60. The etching rate of deposited silicon nitride film according to an embodiment of the present invention, as measured using buffered hydrogen fluoride, may be 2 times to 10 times smaller than a conventional thermal silicon oxide film.

In an embodiment, the first precursor may have a formula of $Si_\alpha H_\beta X_\gamma$, wherein $\alpha$, $\beta$ and $\gamma$ are integers and $\gamma$ includes zero. X can comprise N or $C_m H_n$. In an embodiment, $\alpha$ may be 1~5, $\beta$ may be 1~10, and $\gamma$ may be 0~6. In an embodiment, m may be 2~8, and n may be 6~30.

In an embodiment, the second precursor may be ammonia or $C_x H_y$, or hydrocarbon containing silicon precursor, where x and y is integers. In an embodiment, x may be 1 to 8 and y may be 4 to 18. In an embodiment, hydrocarbon containing silicon precursor may have a formula of $Si_\alpha H_\beta X_\gamma$, wherein $\alpha$, $\beta$ and $\gamma$ are integers. X can comprise N or $C_m H_n$. In an embodiment, $\alpha$ may be 1~5, $\beta$ may be 1~10, and $\gamma$ may be 1~6. In an embodiment, m may be 2~8, and n may be 6~30.

In some embodiments, the first precursor contains no carbon, whereas the second precursor contains hydrocarbon. In some embodiments, the first and second precursors contain hydrocarbon, but the second precursor has more hydrocarbons in its molecule than the first precursor. In some embodiment, the first precursor contains silicon, whereas the second precursor contains no silicon. In some embodiments, the first precursor contains nitrogen, whereas the second precursor contains no nitrogen. The first and second precursors can be defined according to the foregoing definitions in any combinations. In some embodiments, more than two types of precursors can be used.

In any of the foregoing embodiments, the substrate may be kept at a temperature of 0° C. to 400° C. while the film is deposited thereon. In some embodiments, the substrate temperature is about 300° C. to about 400° C. during deposition.

In any of the foregoing embodiments, the first precursor and the second precursor may be introduced in pulses while the reactive gas and the rare gas are continuously introduced and the RF power is continuously applied. In any of the foregoing embodiments, the first precursor and the second precursor may be introduced in pulses of a duration of approximately 0.1 sec to 1.0 sec (e.g., 0.2 sec to 0.3 sec) with intervals of approximately 0.1 sec to 3.0 sec (e.g., 1.0 sec to 2.0 sec). In an embodiment, the pulses duration of the first precursor and the second precursor may be equal to or shorter than the interval.

In any of the foregoing embodiments, the reactive gas may comprise a mixture of nitrogen and hydrogen, or a nitrogen-boron-hydrogen gas. In an embodiment, the reactive gas may comprise a mixture of nitrogen and hydrogen with a molar flow rate ratio of $N_2/H_2$ of approximately 1/10 to 10/1. In some embodiments the molar flow rate ratio of $N_2$ and $H_2$ is about 1/4 to about 4/1.

In any of the foregoing embodiments, the rare gas may be one or more gases selected from the group consisting of He, Ar, Kr, and Xe, and the molar flow rate of the rare gas may be greater than the molar flow rate of the hydrogen-containing silicon source (the sum of the first and second precursors). In an embodiment, a flow rate of the rare gas introduced into the reaction chamber may be about 40 sccm to 4000 sccm. In some embodiments, the flow rate of the rare gas is about 1500 sccm to about 3000 sccm. In an embodiment, the rare gas may comprise a mixture of helium and argon or a mixture of helium and krypton. In an embodiment, the rare gas may comprise a mixture of helium and argon with a molar flow rate ratio of helium/argon of about 1/1 to about 20/1. In some embodiments, the molar flow rate ratio of helium/argon is about 2/1 to about 10/1. In an embodiment, the rare gas comprises a mixture of helium and krypton with a molar flow rate ratio of helium/krypton is about 2/1 to about 10/1.

In any of the foregoing embodiments, the RF power may be applied in the range of approximately 0.01 W/cm² to approximately 1.0 W/cm² per area of the substrate (e.g., a range of 0.02-0.1 W/cm², a range of 0.1-0.5 W/cm², and a range of 0.5-1 W/cm²) and the reaction space pressure may be adjusted in the range of approximately 0.1 Torr to approximately 10 Torr (e.g., 2 Torr to 9 Torr).

In any of the foregoing embodiments, a formed dielectric film may has a step coverage or conformality of at least 80% (e.g., 80% to 95%). In an embodiment, a formed dielectric film may has a leakage current of lower than 1.0E-08 A/cm² at 1 MV (e.g., 1.0E-08 A/cm² to 1.0E-10 A/cm²).

In any of the foregoing embodiments, a formed dielectric film may has various etch resistance depending upon the type of second precursor. In an embodiment, a formed dielectric films in which a hydrocarbon or hydrocarbon containing silicon precursor has been used as the second precursor, have etching rates lower than standard thermal oxide film. The etch resistance is increased by increasing the amount of carbon in some embodiments.

Additionally, a plasma exiting step can be performed using a frequency exceeding 5 MHz, e.g., any one of high RF frequency power of 13.56 MHz, 27 MHz or 60 MHz, in an embodiment; further, any one of the foregoing high RF frequency power and low RF power of 5 MHz or less can be combined wherein a ratio of low-frequency power to high-frequency power may be 50% or less (e.g., 30% or less).

Figure 5:
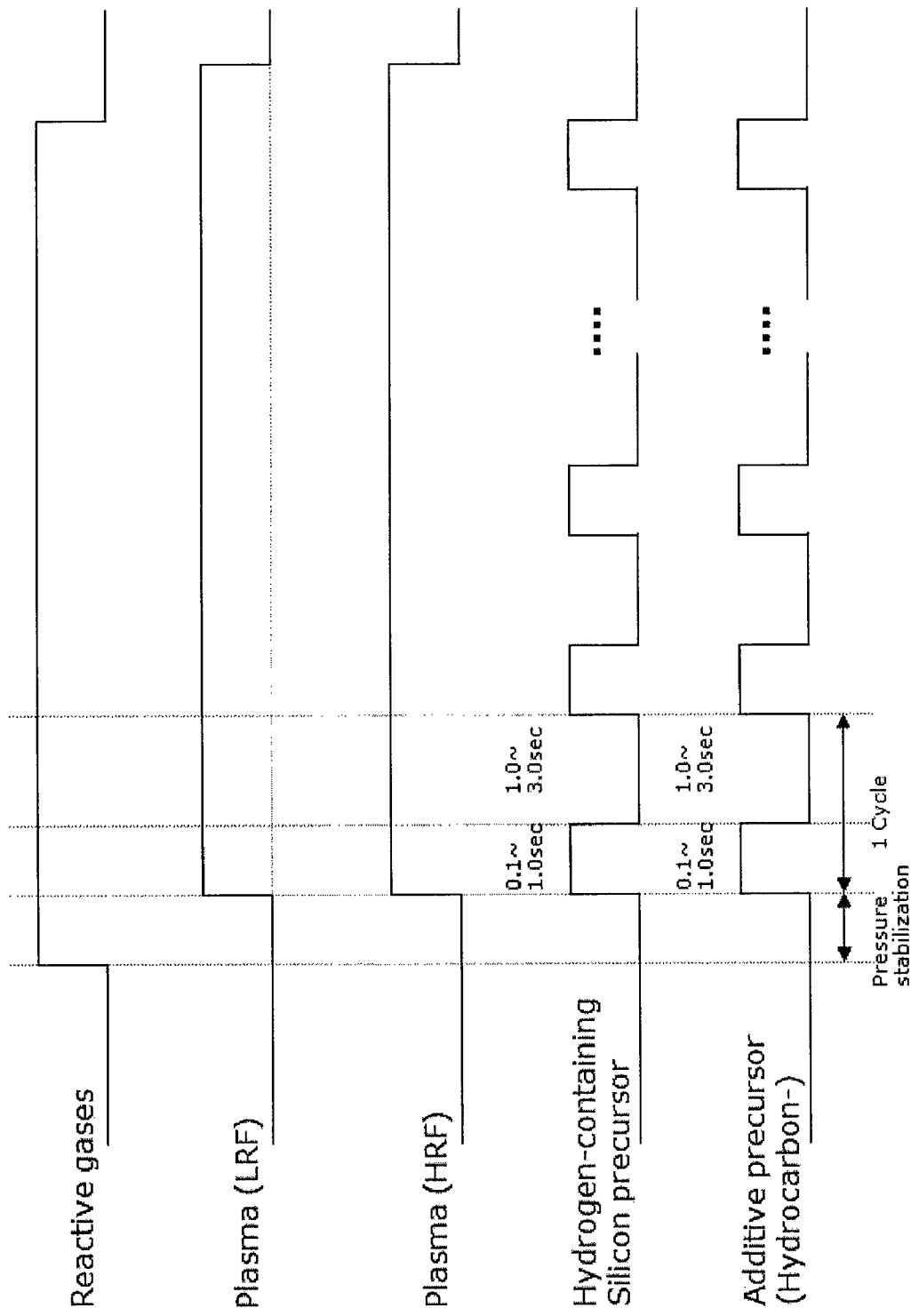
FIG. 5 shows process steps of the modified PECVD method according to an embodiment of the present invention.

FIG. 5 shows process steps of an embodiment of the present invention method for depositing a dielectric film having tuned etch properties. In an embodiment of the present invention as shown FIG. 5, a main precursor (first precursor) and additive precursor (second precursor) in pulses of approximately 0.1 sec to approximately 1.0 sec with intervals of approximately 0.5 sec to approximately 3 sec, using a pulse flow control valve while maintaining plasma polymerization. By doing this, a large amount of hydrogen, nitrogen and carbon can be added to the process which is believed to significantly enhance the Hx, Nx and Cx radicals during film growth, resulting in improving surface absorption of the deposition material so as to form a carbon-doped dielectric film on a substrate with high deposition rates. Furthermore, a composition of deposited film can be altered by adding an additive precursor. The addition of the additive precursor can lead to changes in performance properties such as wet etching rate in etchants.

For forming an etch properties-turned dielectric layer on a semiconductor substrate, deposition conditions may be as follows in an embodiment:

Trisilylamine (first precursor): 10-2000 sccm (preferably 100-500 sccm)
Hydrogen: 20-2000 sccm (preferably 500-1000 sccm)
Nitrogen: 0-5000 sccm (preferably 20-2000 sccm)
Hexane (second precursor): 0-2000 sccm (preferably 100-1500 sccm)
Flow ratio of second precursor to first precursor: 0 to 5 (preferably 1 to 3)
Diethylsilane: 0-2000 sccm (preferably 100-500 sccm)
Bis(ethylmethylamino)silane: 0-2000 sccm (preferably 100-500 sccm)
Process helium: 0-5000 sccm (preferably 500-1500 sccm)
Sealed helium: 200-500 sccm (preferably 300-500 sccm)
Argon: 50-2000 sccm (preferably 500-1500 sccm)
Substrate temperature: 0-400° C. (preferably 300-400° C.)
High frequency RF power: 0.01 W/cm² to about 0.3 W/cm² (preferably 0.02-0.08 W/cm²)
Low frequency RF power: 0-100% of high frequency RF power (preferably 0-50%)
Trisilylamine supply time: 0.1-1.0 sec supply (preferably 0.2-0.5 sec), 0.1~2.0 sec supply stop (preferably 1.0-2.0 sec)
Additive precursor (Hexane) supply time: 0.1-1.0 sec supply (preferably 0.2-0.5 sec, equal to or longer than the first precursor supply time with the same timing of pulsing as the first precursor supply)

In the above, other types of gases as described in this disclosure can alternatively or additionally be used in other embodiments. For example, instead of hexane, bis(ethylmethyamino)silane or diethylsislane can be used as the second precursor. Preferably, the second precursor has more hydrocarbons in its molecule than the first precursor, thereby incorporating more carbons in SiN structures (carbon-doped silicon nitride). In embodiments, the carbon content of the SiN dielectric layer (wherein Si—N bonds are main or predominant bonds) may be in a range of 4 atomic % to 20 atomic %, preferably higher than 5 atomic % (including higher than 10 atomic % and higher than 15 atomic %). The second precursor need not contain silicon in an embodiment. By increasing the pulse duration of the second precursor (e.g., at least 2 times or 4 to 10 times longer than that of the first precursor) and/or shortening the length of one cycle of the second precursor (e.g., ½, ⅓, ¼, or ⅕ of that of the first precursor), the carbon content of the resulting conformal dielectric film can be increased, e.g., in a range of more than 20% to about 50% (atomic %). In an embodiment, the carbon content of the resulting film can be adjusted as a function of the pulse duration of the second precursor based on a relation, e.g., C=16.7P+0.02 wherein C is the carbon content (atomic %), and P is the pulse duration (sec) of the second precursor. Further, the carbon content can be increased by reducing the nitrogen gas flow.

The dielectric layer according to embodiments of the present invention may have conformality of more than about 90%. The reflective index (n) measured at 633 nm may be in the range of about 1.80 to about 2.80. The etching rate of deposited dielectric film according to an embodiment of the present invention as measured using acids solutions containing hydrofluoric acid can be altered by adding additive precursor. The wet etching rate of dielectric layers obtained using first and second precursors can surprisingly and unexpectedly be 1/20 to 1/400 (e.g., less than 1/100) of the wet etching rate of a standard thermal oxide layer, depending upon the type of second precursor. The wet etching rate of dielectric layers obtained without using the second precursor may be 1/3 to 1/5 of the wet etching rate of a standard thermal oxide layer in some embodiments.

Figure 11A:
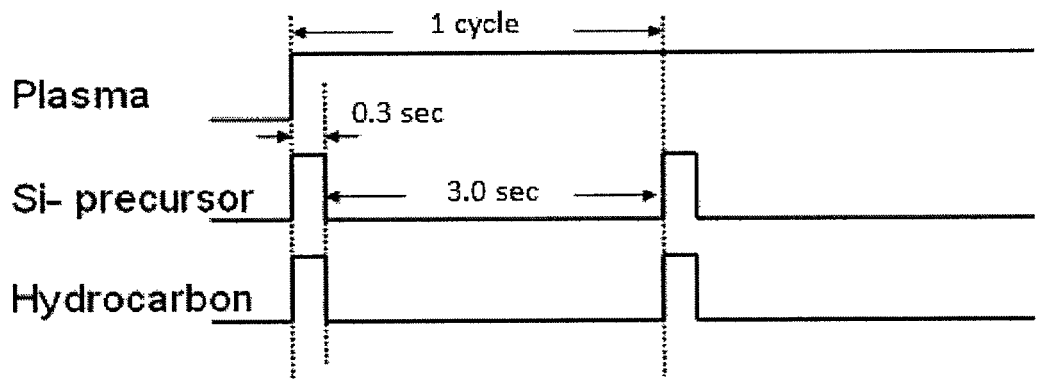
FIGS. 11A-11C show process steps according to embodiments of the present invention for depositing a silicon nitride film.
Figure 11B:
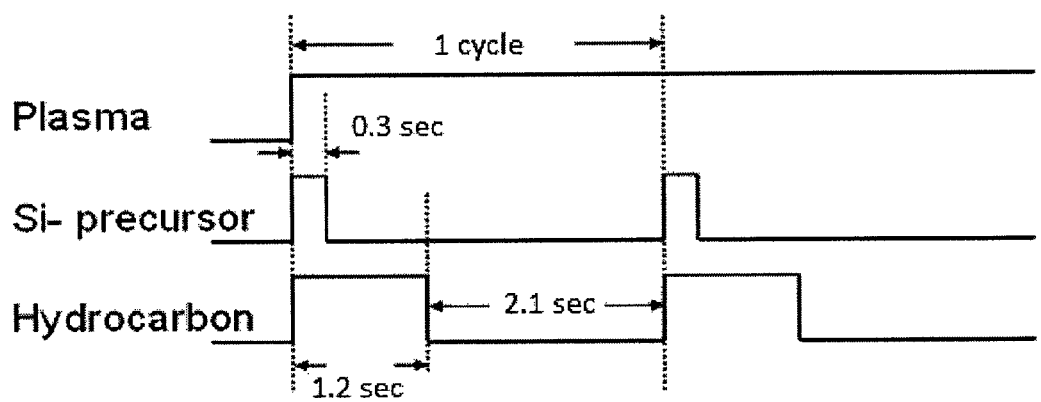
Figure 11C:
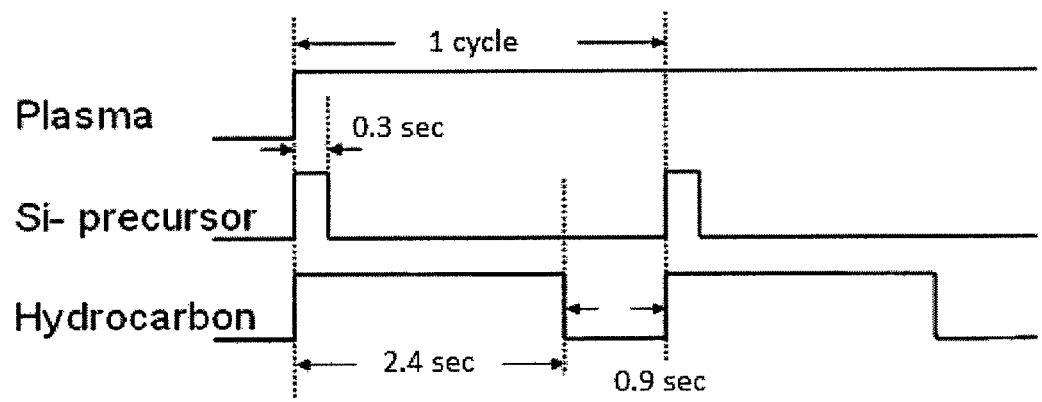
Figure 16:
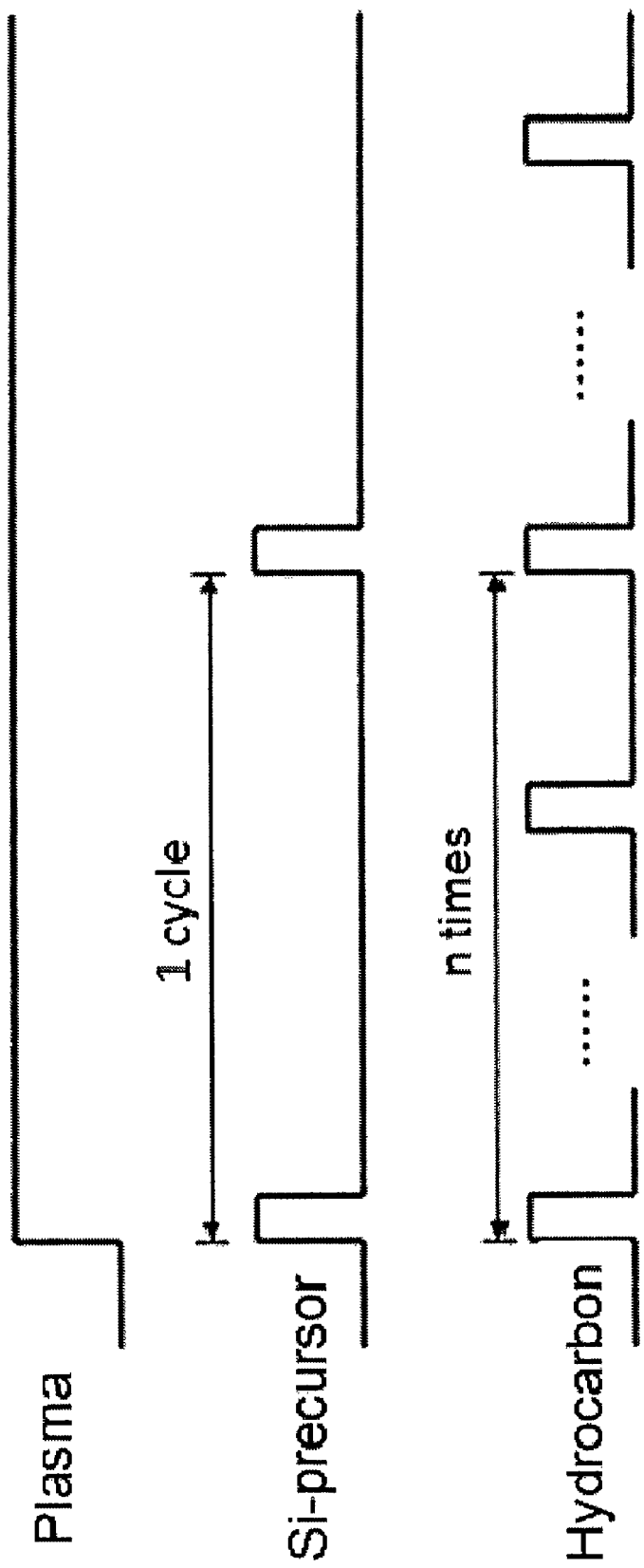
FIG. 16 shows a process step according to an embodiment of the present invention for depositing a silicon nitride film.

In some embodiments of the present invention, the second precursor is introduced into the reaction space in pulses having a pulse duration equal to or longer than that of the first precursor. FIG. 11A illustrates an embodiment where the cycles of the first and second precursors are synchronized (one cycle to one cycle), and the pulse duration of the second precursor is equal to that of the first precursor (the pulse duration of the first precursor is 0.3 sec, the length of one cycle of the first precursor is 3.0 sec, and the pulse duration of the second precursor is 1.2 sec). FIG. 11B illustrates an embodiment where the pulse duration of the second precursor is four times longer than that of the first precursor in the synchronized cycles (the cycle of the first precursor is the same as in FIG. 11A, and the pulse duration of the second precursor is 1.2 sec). FIG. 11C illustrates an embodiment where the pulse duration of the second precursor is eight times longer than that of the first precursor in the synchronized cycles (the cycle of the first precursor is the same as in FIG. 11A, and the pulse duration of the second precursor is 2.4 sec). In some embodiments, while introducing the first precursor into the reaction space, the second precursor is always introduced. In some embodiments, multiple cycles of the second precursor are performed per cycle of the first precursor. FIG. 16 illustrates an embodiment where the cycles of the first and second precursors are synchronized but multiple cycles of the second precursor are performed per cycle of the first precursor. In this figure, the pulse duration of the second precursor is the same as that of the first precursor, but can be adjusted as shown in FIGS. 11B and 11C.

The embodiments will be explained with reference to specific examples which are not intended to limit the present invention. The numerical numbers applied in the specific examples may be modified by a range of at least ±50% in other conditions, wherein the endpoints of the ranges may be included or excluded. In the present disclosure where conditions and/or structures are not specified, the skilled artisan in the art can readily provide such conditions and/or structures, in view of the present disclosure, as a matter of routine experimentation.

EXAMPLE 1

No Second Precursor

An insulative silicon nitride layer was formed on a substrate having trenches under the conditions shown below using the sequence illustrated in FIG. 2b and the PECVD apparatus illustrated in FIG. 1. The trenches included relatively wide trenches (a width of 500 nm and a depth of 350 nm) and relatively narrow trenches (a width of 50 nm and a depth of 350 nm). Thus trenches of different aspect ratio were coated.
  Silane: 50 sccm
  Hydrogen: 1000 sccm
  Nitrogen: 2000 sccm
  Process helium: 2000 sccm
  Sealed helium: 500 sccm
  Argon: 100 sccm
  Substrate Temp.: 300° C.
  RF power (a frequency of 13.56 MHz): 0.12 W/cm$^2$
  Pressure: 6 Ton
  Silane supply time: 1 sec supply, 3 sec supply stop After completion of the deposition, the trenches were observed with a scanning electron microscope.

It was confirmed that the step coverage (conformality) was more than 80% (80%-87%), defined as the ratio between the thickness of the sidewall to the thickness of the top coverage. In contrast, the film obtained by the process following the sequence illustrated in FIG. 2a had a step coverage of less than 70%.

EXAMPLE 2

No Second Precursor

An insulative silicon nitride layer was formed on a substrate having trenches under the conditions shown below using the sequence illustrated in FIG. 2b and the PECVD apparatus illustrated in FIG. 1. The trenches included relatively wide trenches (a width of 500 nm and a depth of 350 nm) and relatively narrow trenches (a width of 50 nm and a depth of 350 nm).
  Trisilylamine: 300 sccm
  Hydrogen: 500 sccm
  Nitrogen: 1000 sccm
  Process helium: 1400 sccm
  Sealed helium: 500 sccm
  Argon: 500 sccm
  Substrate temp.: 300° C.
  RF power (a frequency of 13.56 MHz): 0.12 W/cm2
  Pressure: 6 Torr
  Trisilylamine supply time: 0.2 sec supply, 2 sec supply stop After completion of the deposition, the trenches were observed with a scanning electron microscope (SEM).

Figure 3A:
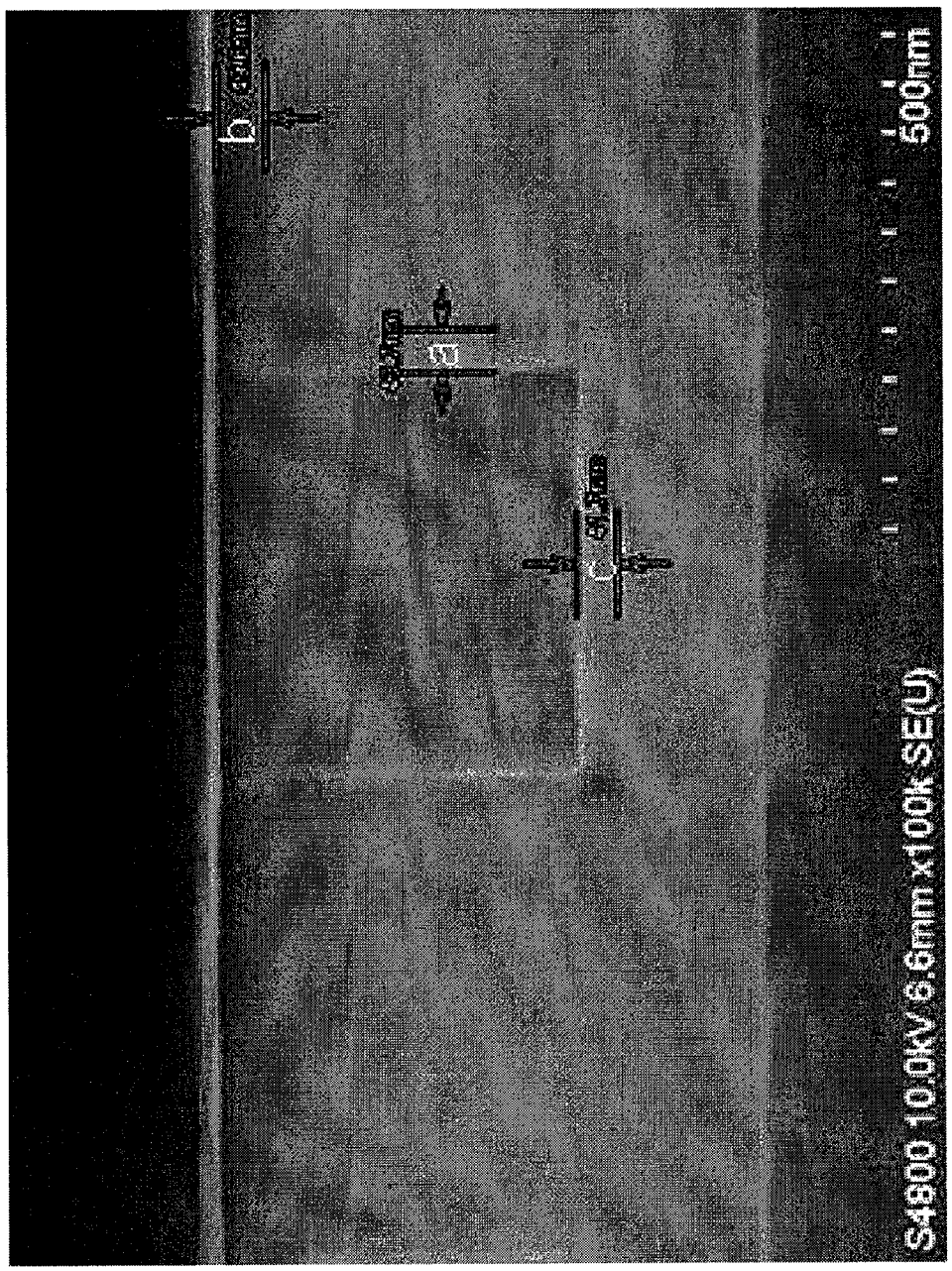
FIGS. 3a and 3b are Scanning Electron Microscope (SEM) photographs of cross-sectional views of conformal silicon nitride films formed according to an embodiment related to the present invention.
Figure 3B:
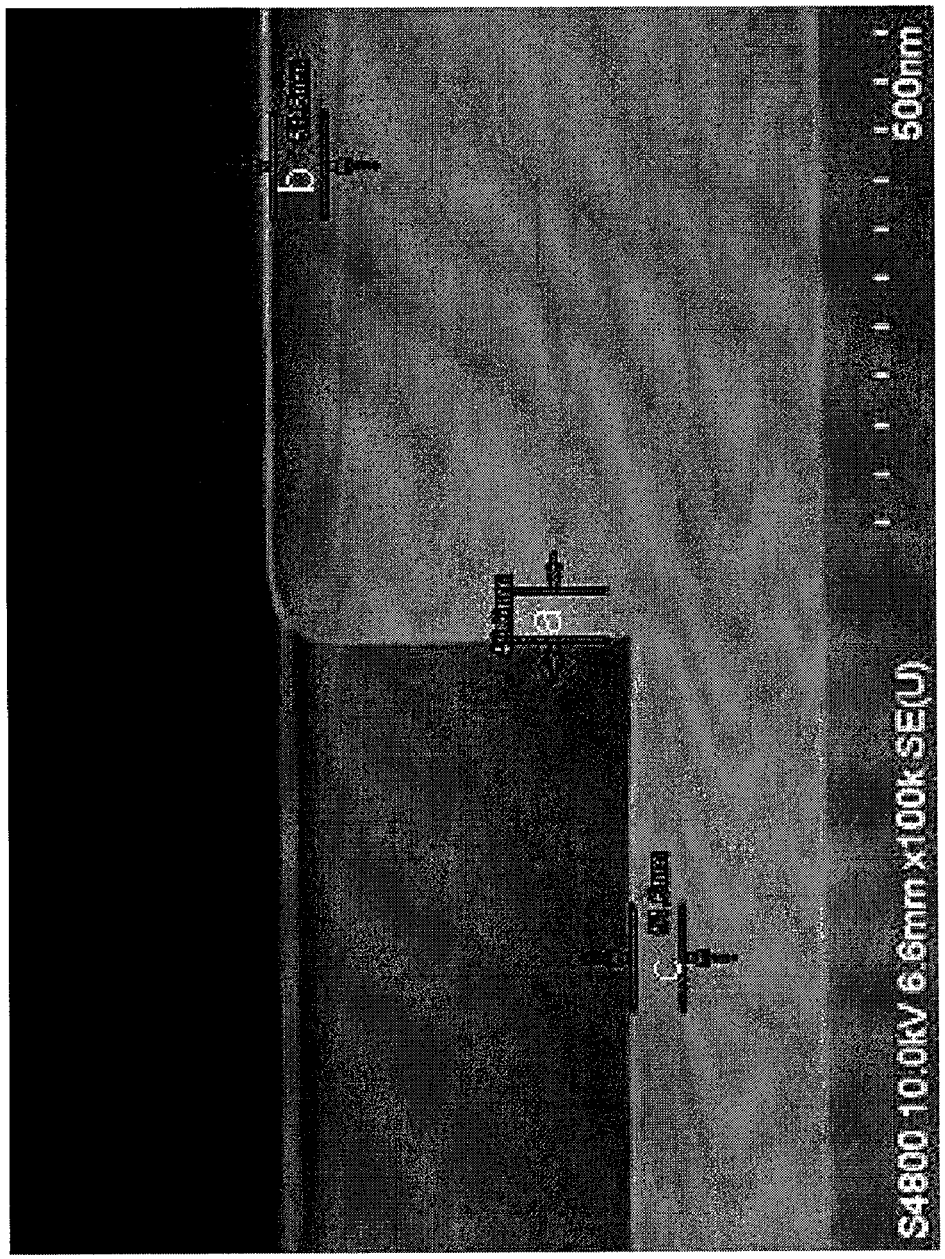
Figure 4:
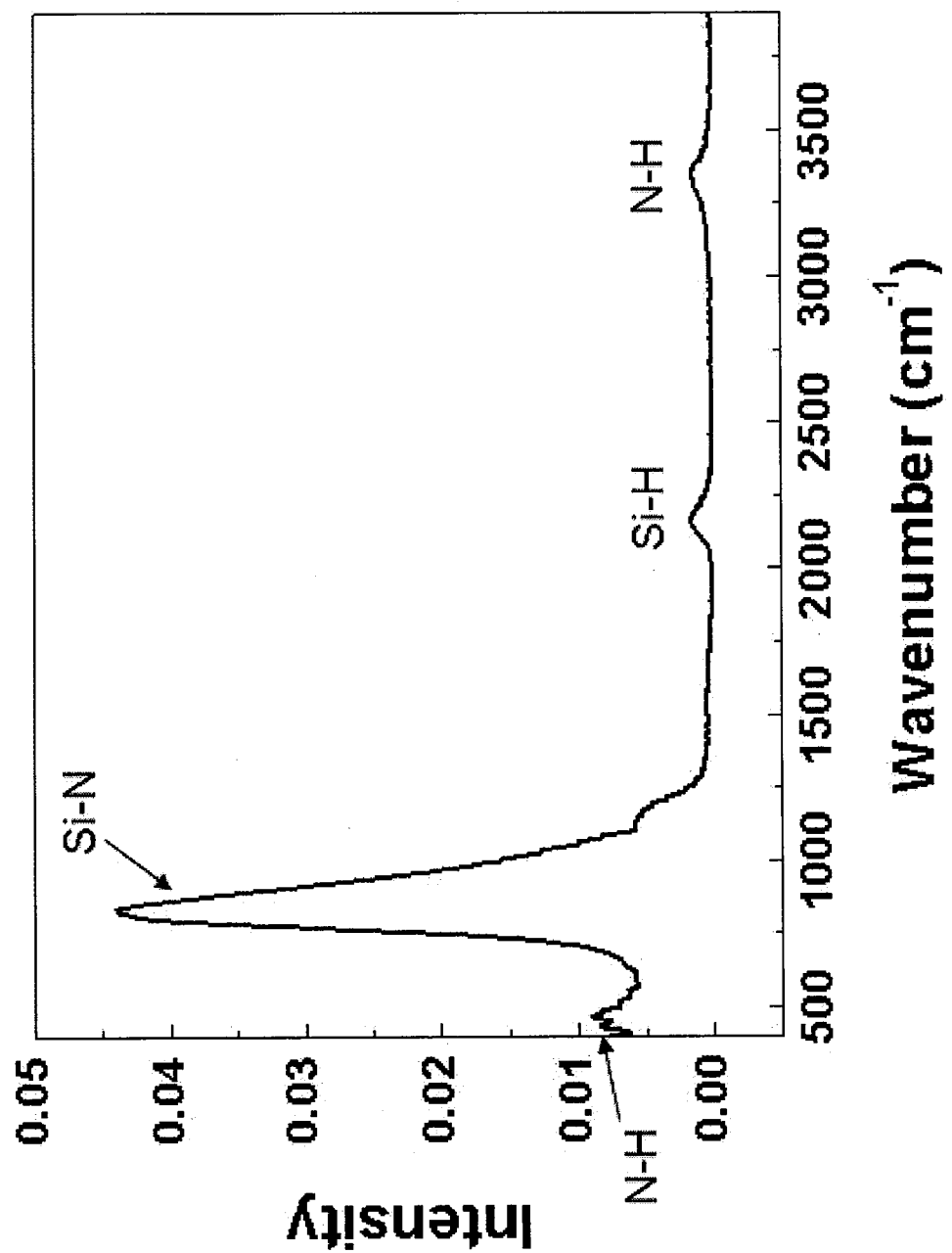
FIG. 4 is a Fourier Transform Infrared (FT-IR) spectrum of a conformal silicon nitride film formed according to an embodiment related to the present invention.

FIGS. 3a and 3b show the scanning electron microscope cross-sectional view of the substrate with the conformal silicon nitride layer formed. Qualitatively, the silicon nitride layer is highly conformal and completely covers the trench sidewalls. The silicon nitride layer had a conformality of 88% (43.7/49.6) as shown in FIG. 3a (a=43.7 nm, b=49.6 nm, c=41.7 nm) and 96% (49.6/51.6) as shown in FIG. 3b (a=49.6 nm, b=51.6 nm, c=51.6 nm). The measured leakage current was lower than 1.0E-08 A/cm$^2$ at a 1 MV charge. The dielectric constant was 6.8 at 1 MHz. The refractive index (n) at 633 nm was 1.99. FIG. 4 shows the IR absorption spectra of the deposited silicon nitride film. As shown in FIG. 4, the main Si—N band can be observed and the Si—H and N—H weak bands are also observed. The etching rate of deposited silicon nitride film in this example as measured using buffered hydrogen fluoride was 4 times smaller than a conventional thermal silicon oxide film. The etching test was carried out using a BHF130 etchant. The deposited film (SiN) on the Si substrate was dipped in the BHF130 etchant for 5 min, and then rinsed with de-ionized water. Film thickness was measured by an Ellipsometer.

A significant advantage of the method of at least one of the disclosed embodiments of the present invention is that highly-conformal silicon nitride layers or other Si—N dielectric layers can be formed on various types of substrates. The silicon nitride coatings and other Si—N dielectrics films also may be formed at relatively low substrate temperatures, thereby increasing productivity without thermal damage or consumption of excess thermal budget to the substrate, and thereby expanding the types of applicable substrates. In addition, the method of an embodiment of the present invention can achieve high deposition rates, and can be readily scalable, thereby allowing large-scale application and/or three-dimensional production such as 3D integration of die-to-wafer or wafer-to-wafer.

EXAMPLE 3

No Second Precursor

Figure 6:
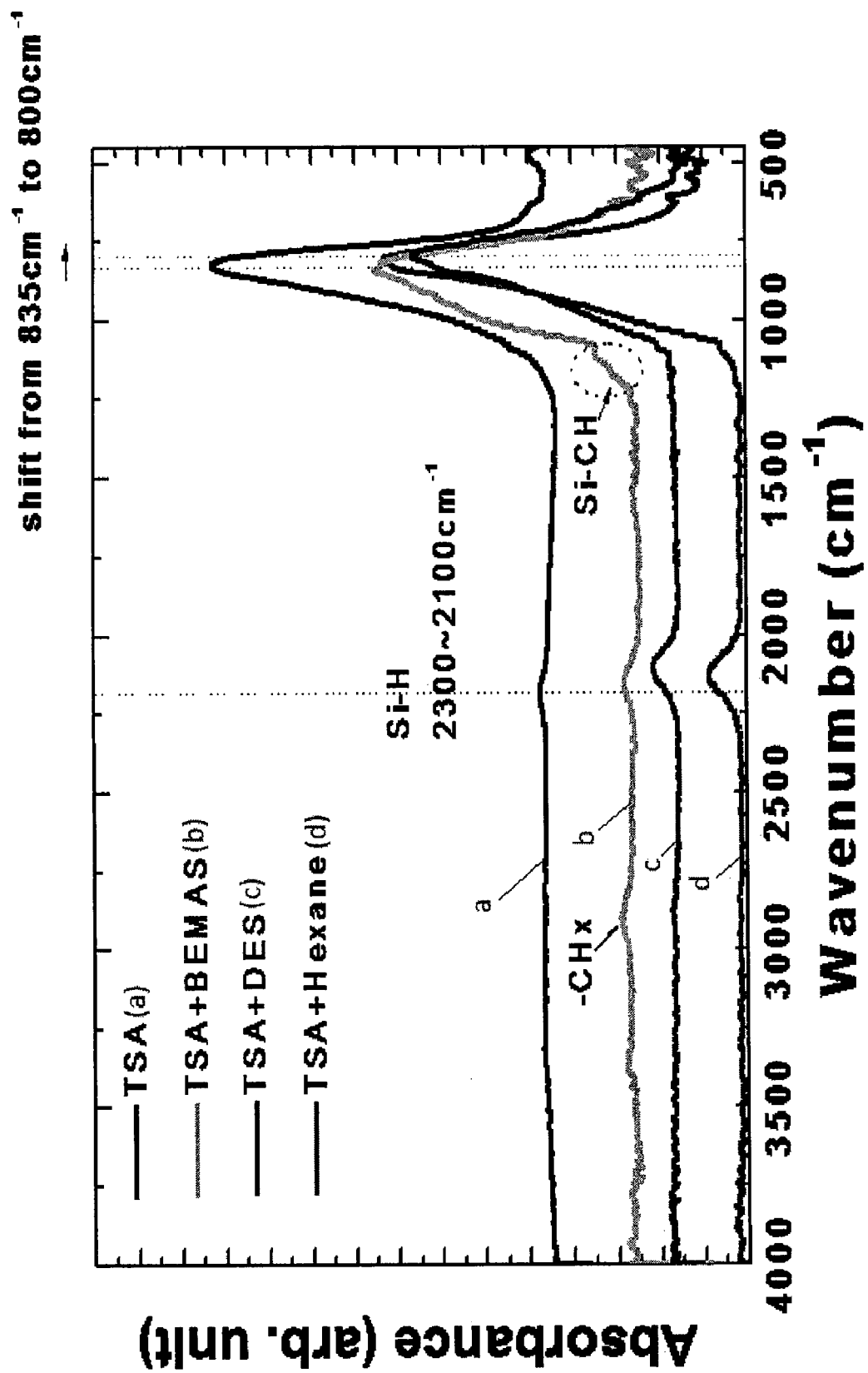
FIG. 6 shows FT-IR spectra of dielectric films according to embodiments of the present invention.
Figure 7:
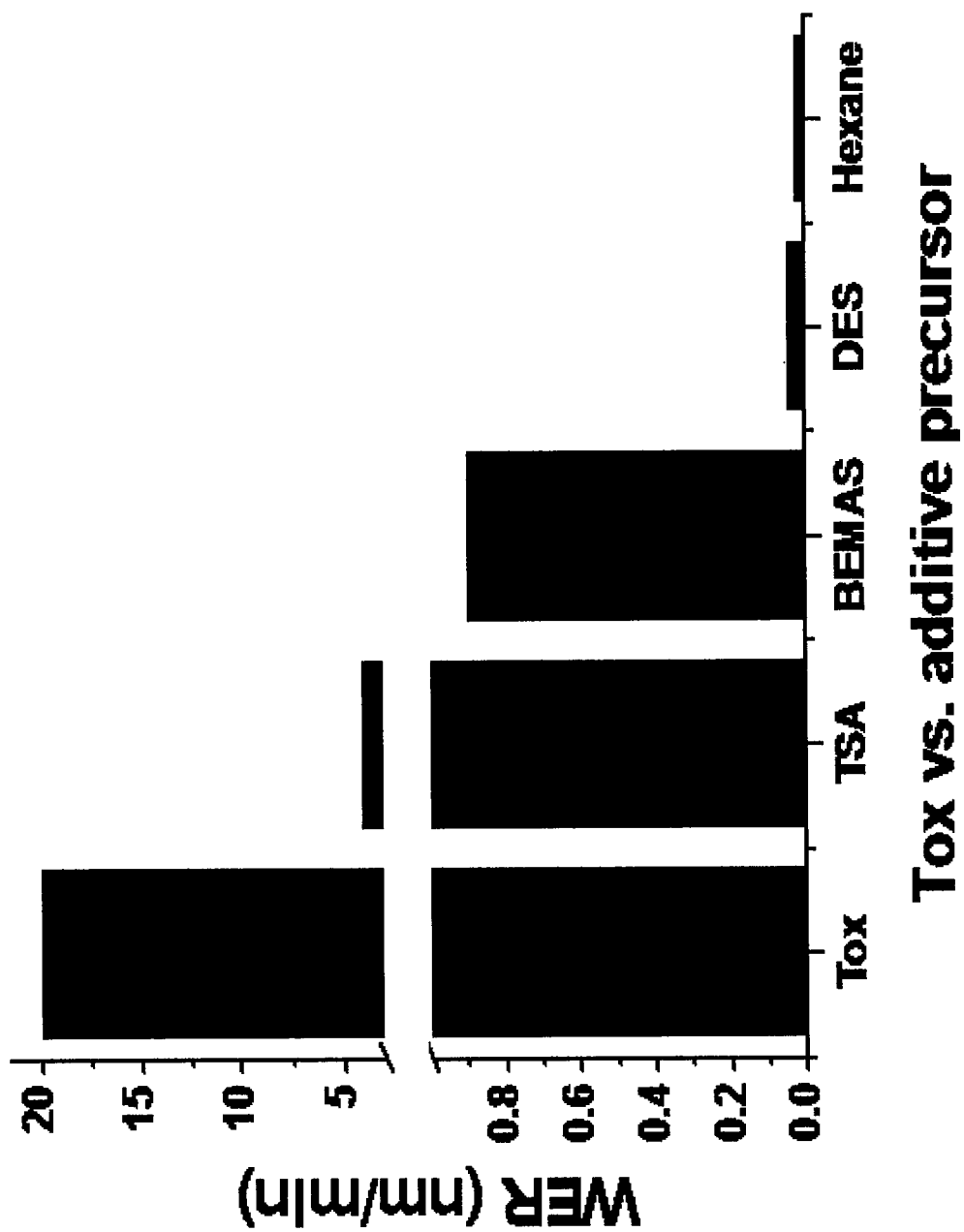
FIG. 7 is a graph showing wet etching rates of dielectric layers according to embodiments of the present invention in comparison with that of a standard thermal oxide layer.

A dielectric layer was formed without an additive precursor on a substrate under the conditions shown below based on the sequence illustrated in FIG. 5.
  Trisilylamine: 100 sccm
  Hydrogen: 500 sccm
  Nitrogen: 1000 sccm
  Process helium: 1400 sccm
  Sealed helium: 500 sccm
  Argon: 1000 sccm
  Substrate temperature: 400° C.
  High frequency RF power (a frequency of 13.56 MHz): 0.07 W/cm$^2$
  Low frequency RF power (a frequency of 430 kHz): 0.0 W/cm$^2$
  Trisilylamine supply time: 0.3 sec supply, 2.0 sec supply stop In this case, the film thickness per cycle was approximately 0.20 nm/cycle. FIG. 6 (TSA: line (a)) shows the IR absorption spectrum of the deposited SiN film obtained in Example 3. The deposited dielectric film without an additive precursor has a wet etching rate of 4.1 nm/min as shown in FIG. 7 (TSA). The etching test was carried out using a BHF130 etchant. The deposited film on the Si substrate was dipped in the etchant for 5 min, and then rinsed with de-ionized water. Film thickness was measured by an Ellipsometer.

EXAMPLE 4

Second Precursor: BEMAS

A dielectric layer was formed with an additive precursor, bis(ethylmethylamino)silane, on a substrate under the conditions shown below using the sequence illustrated in FIG. 5.
  Trisilylamine: 100 sccm
  Hydrogen: 500 sccm
  Nitrogen: 0 sccm
  Bis(ethylmethylamino)silane: 300 sccm
  Process helium: 1400 sccm
  Sealed helium: 500 sccm
  Argon: 1000 sccm
  Substrate temperature: 400° C.
  High frequency RF power (a frequency of 13.56 MHz): 0.07 W/cm$^2$
  Low frequency RF power (a frequency of 430 kHz): 0.0 W/cm$^2$
  Trisilylamine supply time: 0.3 sec supply, 2.0 sec supply stop
  Bis(ethylmethylamino)silane: 0.3 sec supply, 2.0 sec supply stop In this case, the film thickness per cycle was approximately 0.25 nm/cycle. FIG. 6 (TSA+BEMAS: line (b)) shows the IR absorption spectrum of the deposited C-doped SiN film obtained in Example 4, wherein a Si—CH peak (1130-1090 cm$^{-1}$) and a —CHx peak are observed. The deposited dielectric film with the addition of bis(ethylmethylamino)silane has a wet etching rate of 0.9 nm/min under BHF130 etchant as shown in FIG. 7 (BEMAS).

EXAMPLE 5

Second Precursor: DES

A dielectric layer was formed with an additive precursor, diethylsilane, on a substrate under the conditions shown below using the sequence illustrated in FIG. 5.
  Trisilylamine: 100 sccm
  Hydrogen: 500 sccm
  Nitrogen: 0 sccm
  Diethylsilane: 300 sccm
  Process helium: 1400 sccm
  Sealed helium: 500 sccm
  Argon: 1000 sccm
  Substrate temperature: 400° C.
  High frequency RF power (a frequency of 13.56 MHz): 0.07 W/cm$^2$
  Low frequency RF power (a frequency of 430 kHz): 0.0 W/cm$^2$
  Trisilylamine supply time: 0.3 sec supply, 2.0 sec supply stop
  Diethylsilane: 0.3 sec supply, 2.0 sec supply stop In this case, the film thickness per cycle was approximately 0.11 nm/cycle. FIG. 6 (TSA+DES: line (c)) shows the IR absorption spectrum of the deposited C-doped SiN film obtained in Example 5, wherein the main peak is shifted from 835 cm$^{-1}$ to 800 cm$^{-1}$. The Si—N absorption peak normally appears in a range of 812 cm$^{-1}$ to 892 cm$^{-1}$ (e.g., $Si_3N_4$ appears at around 830 cm$^{-1}$), whereas the Si—C absorption peak appears in a range of 900 cm$^{-1}$ to 700 cm$^{-1}$, 814 cm$^{-1}$ to 800 cm$^{-1}$. The shift of absorption peak indicates that carbons exist in the deposited film. The deposited dielectric film with the addition of diethylsilane has a wet etching rate of 0.05 nm/min under BHF130 etchant.

EXAMPLE 6

Second Precursor: Hexane

Figure 12:
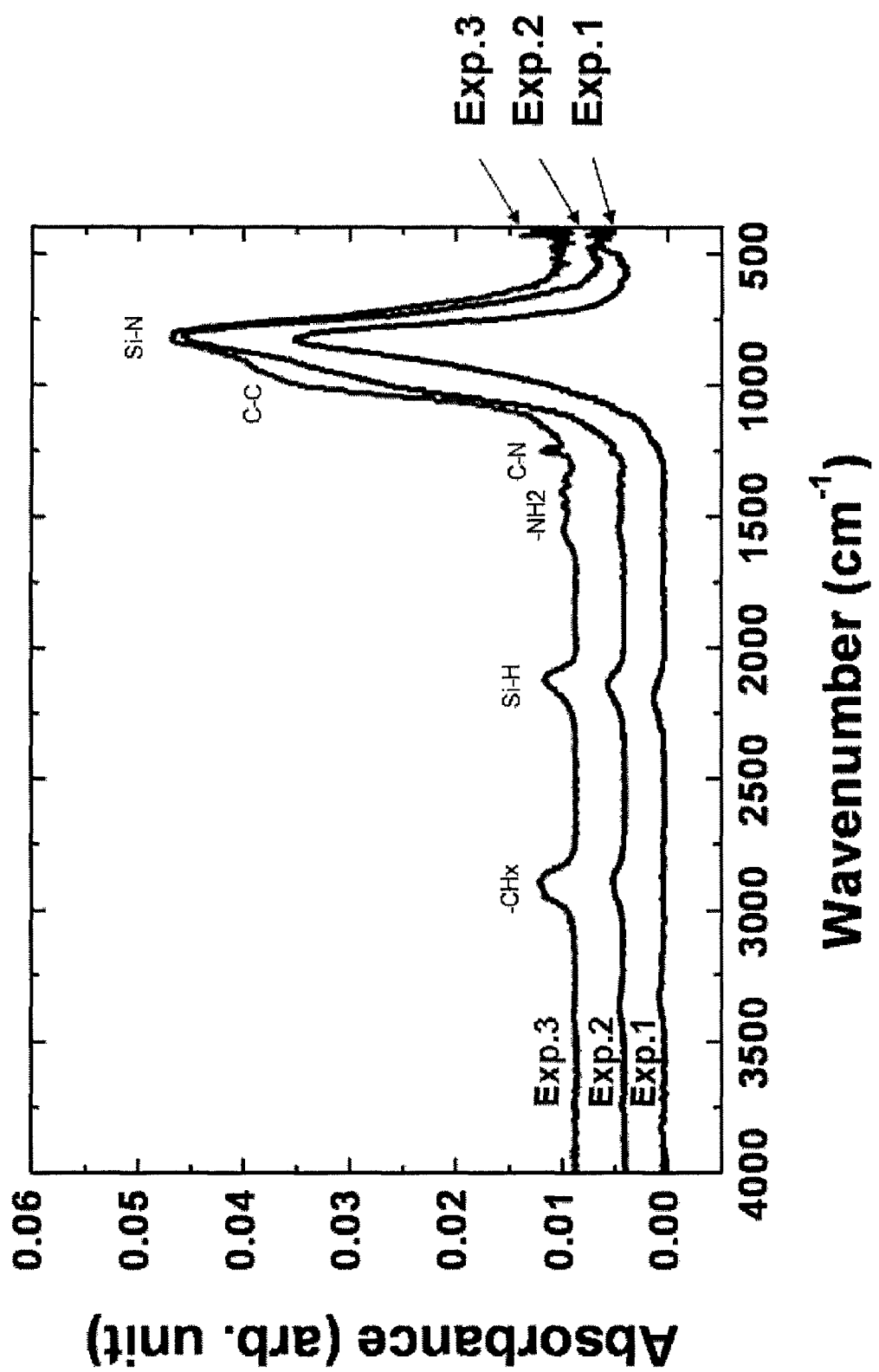
FIG. 12 shows FT-IR spectra of dielectric films according to embodiments of the present invention.

A dielectric layer was formed with additive precursor, for example Hexane, on a substrate under the condition shown below using the sequence illustrated in FIG. 1.
  Trisilylamine: 100 sccm
  Hydrogen: 500 sccm
  Nitrogen: 0 sccm
  Hexane: 300 sccm
  Process helium: 1400 sccm
  Sealed helium: 500 sccm
  Argon: 1000 sccm
  Substrate temperature: 400° C.
  High frequency RF power (a frequency of 13.56 MHz): 0.07 W/cm$^2$
  Low frequency RF power (a frequency of 430 kHz): 0.0 W/cm$^2$
  Trisilylamine supply time: 0.3 sec supply, 2.0 sec supply stop
  Hexane: 0.3 sec supply, 2.0 sec supply stop In this case, the film thickness per cycle was approximately 0.11 nm/cycle. FIG. 6 (TSA+Hexane: line (d)) shows the IR absorption spectrum of the deposited C-doped SiN film obtained in Example 6, wherein the main peak is shifted from 835 cm$^{-1}$ to 800 cm$^{-1}$. The Si—N absorption peak normally appears in a range of 812 $cm^{-1}$ to 892 $cm^{-1}$ (e.g., $Si_3N_4$ appears at around 830 $cm^{-1}$), whereas the Si—C absorption peak appears in a range of 900 $cm^{-1}$ to 700 $cm^{-1}$, 814 $cm^{-1}$ to 800 $cm^{-1}$. The shift of absorption peak indicates that carbons exist in the deposited film. The deposited dielectric film with the addition of hexane has a wet etching rate of 0.03 nm/min under BHF130 etchant as shown in FIG. 7 (Hexane). As shown in FIG. 6, even though the second precursor is hydrocarbon (hexane), when the pulse duration of the second precursor is the same as that of the silicon precursor (Example 6), the —CHx peak does not clearly appear, i.e., the carbon concentration may not be significantly increased. However, as shown in FIG. 12 described later (Examples 9 and 10), when the pulse duration of the second precursor is increased relative to that of the first precursor, the carbon content of the resulting film can be increased as a function of the pulse duration.

FIG. 7 shows the comparisons of wet etching rate of thermal oxide with those of the deposited films (TSA only, TSA+BEMAS, TSA+DES and TSA+Hexane).

Table 1 shows a summary of the above Examples. By adding the additive precursor, the composition of deposited film can be altered. These added precursors can lead to changes in performance properties such as wet etching rate in etchants.

layers were deposited with TSA and Hexane. Nitrogen flow was varied from 0 sccm to 1000 sccm and Hexane supply time was varied from 0.1 sec to 0.5 sec. Other process conditions were the same as in Example 6. By varying the process conditions, the wet etching rate and film properties of deposited films were altered. According to Table 2, the wet etching rate was decreased with decreasing nitrogen flow, and the reflective index was decreased with increasing nitrogen flow. These indicate that it is possible to control the compositions of carbon-doped dielectric layers using a combination of chemical and process control variables.

Figure 8:
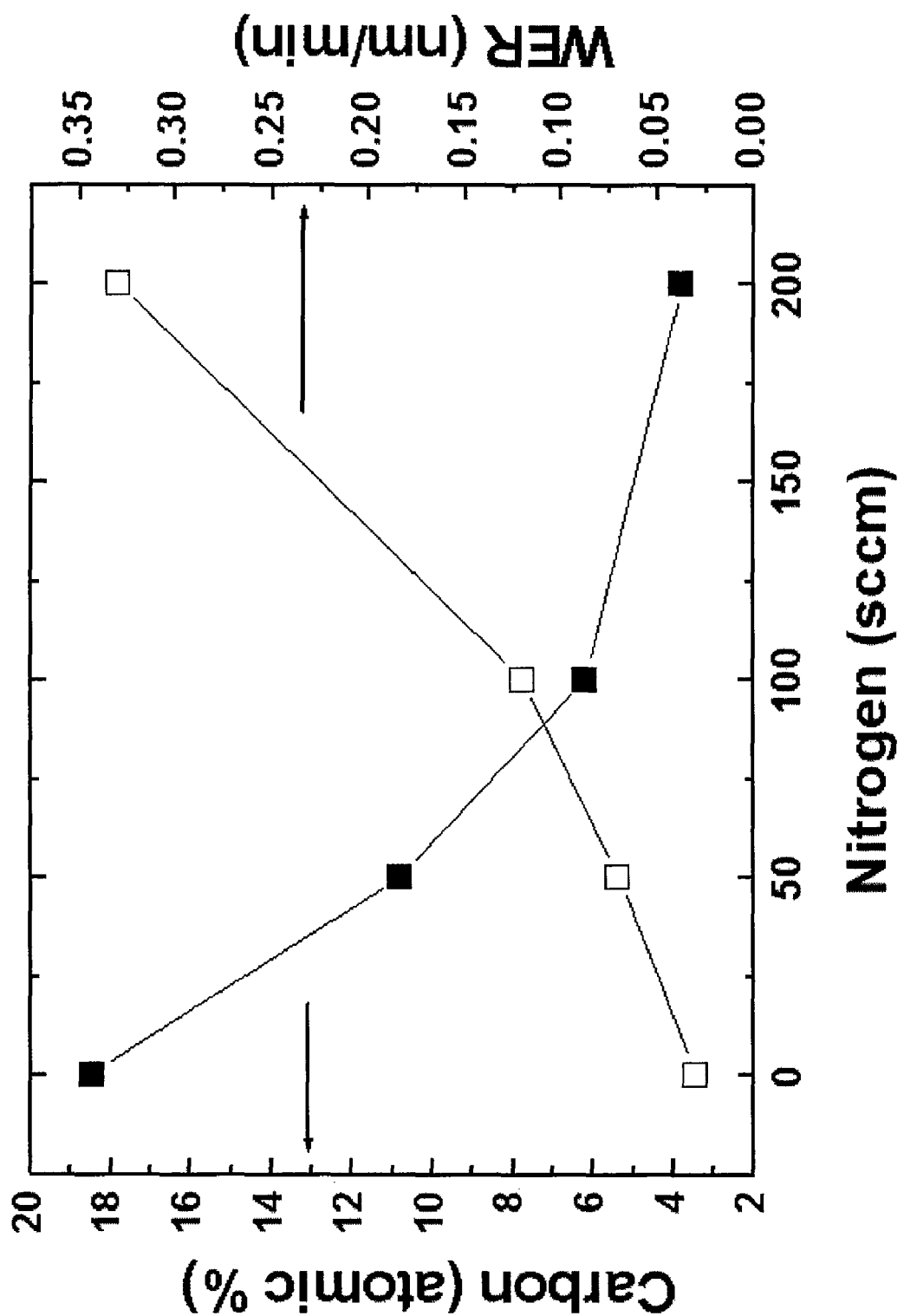
FIG. 8 is a graph showing the relationship between nitrogen flow rate and wet etching rate and carbon concentration in films according to an embodiment related to the present invention.

FIG. 8 shows the BHF130 wet etching rate and carbon concentration in the films as a function of the nitrogen flow. The amount of carbon was determined by RBS/HFS measurement and XPS analysis. The lower the nitrogen flow, the higher the carbon content becomes and the lower the wet etching rate becomes. It is understood that a carbon content of 5 atomic % or higher, 10 atomic % or higher, is preferable in view of good wet etching resistance.

Figure 9:
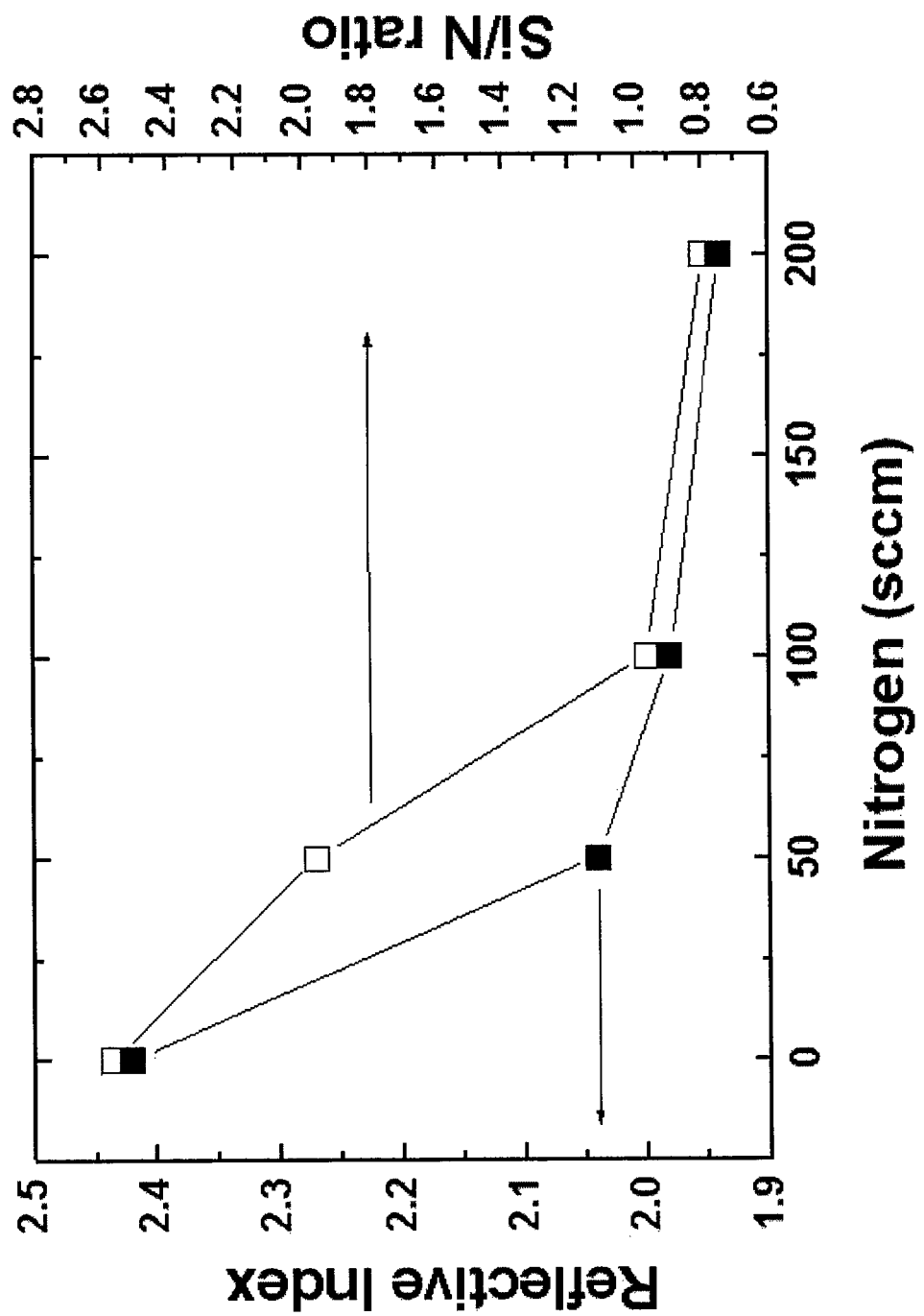
FIG. 9 is a graph showing the relationship between nitrogen flow and reflective index and Si/N ratio according to an embodiment related to the present invention.

FIG. 9 shows the reflective index and Si/N ratio as a function of the nitrogen flow. The amounts of silicon and nitrogen (Si/N ratio) were determined by RBS/HFS measurement and

TABLE 1

Wet etching rate with various additive precursors

| Main precursor | Additive precursor | Supply time (main/additive) | Interval | RF power | WER (nm/min) | Ref. |
| --- | --- | --- | --- | --- | --- | --- |
| Trisilylamin (TSA) | None | 0.3 sec/0.3 sec | 2.0 sec | 0.07 $W/cm^2$ | 4.1 | SiN |
| | Bis(ethylmethyllamino)silane (BEMAS) | | | | 0.9 | SiCN |
| | Diethylsilane (DES) | | | | 0.05 | SiCN |
| | n-Hexane | | | | 0.03 | SiCN |

In Examples 4-6, the conformality (step coverage: side/top) of the resultant SiCN films was around 94% which was better than those in Examples 1 and 2.

EXAMPLE 7

Second Precursor: Hexane

Table 2 shows the changes of wet etching properties and film properties under various process conditions. Dielectric XPS analysis. The lower the nitrogen flow, the higher the reflective index becomes and the higher the Si/N ratio becomes. In view of reflective index, a Si/N ratio of higher than 1.0 is preferable.

Figure 10:
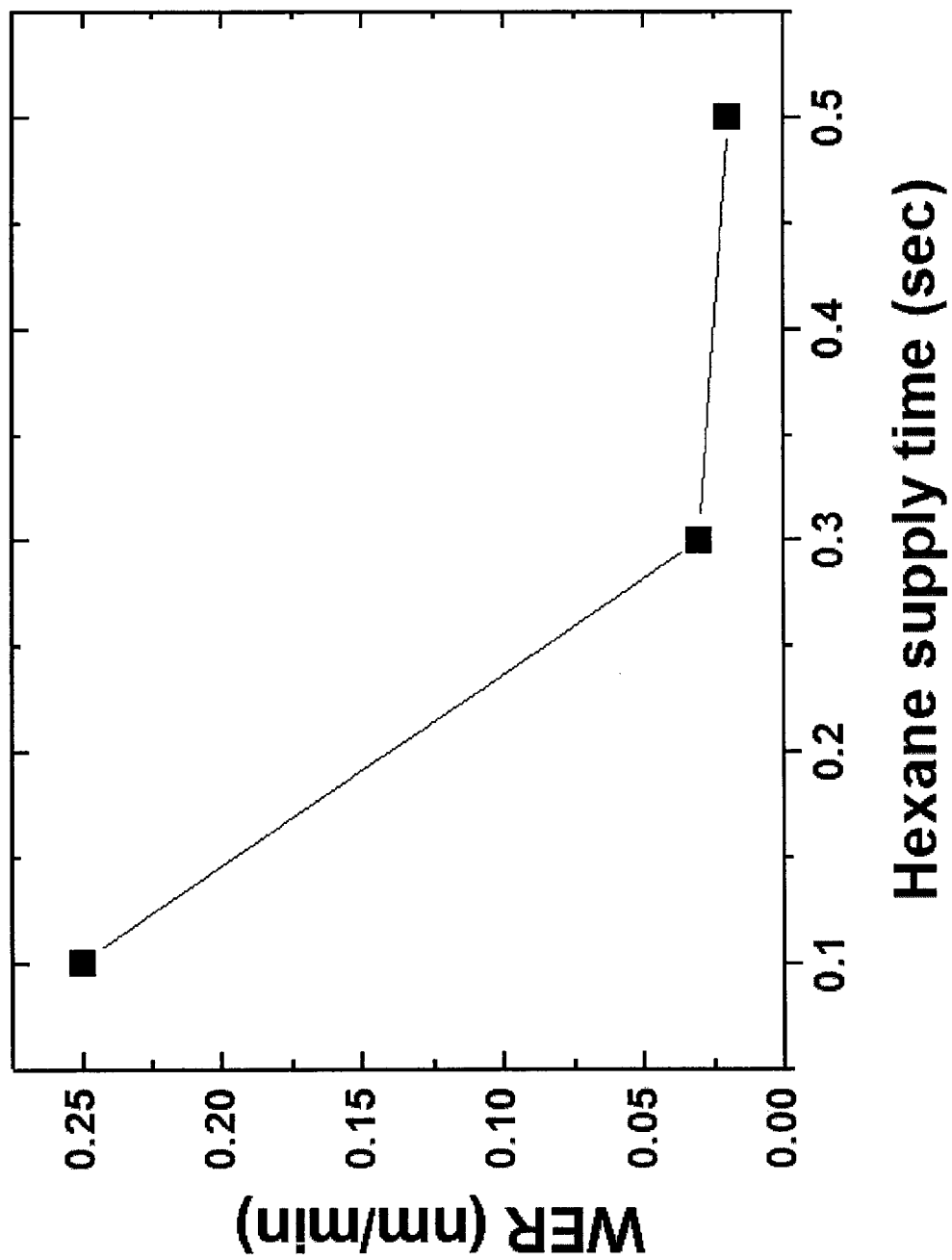
FIG. 10 is a graph showing the relationship between hexane supply duration and wet etching rate according to an embodiment of the present invention.

FIG. 10 shows the BHF130 wet etching rate change with hexane supply time. When the hexane supply time is equal to or longer than that of the first precursor, the wet etching resistance becomes extremely high.

TABLE 2

Wet etching rate and reflective index change under various process conditions

| Main precursor (supply time) | Additive precursor (supply time) | Interval | Nitrogen (sccm) | RF power | WER (nm/min) | R.I. |
| --- | --- | --- | --- | --- | --- | --- |
| Trisilylamin (0.3 sec) | n-Hexane (0.3 sec) | 2.0 sec | 1000 | 0.07 $W/cm^2$ | 1.02 | 1.90 |
| | | | 800 | | 0.86 | 1.91 |
| | | | 500 | | 0.63 | 1.92 |
| | | | 200 | | 0.33 | 1.94 |
| | | | 100 | | 0.12 | 1.98 |
| | | | 50 | | 0.07 | 2.04 |
| | | | 0 | | 0.03 | 2.42 |
| Trisilylamin (0.3 sec) | n-Hexane (0.1 sec) | | 0 | | 0.25 | 2.56 |
| Trisilylamin (0.3 sec) | n-Hexane (0.5 sec) | | 0 | | 0.02 | 2.31 |

A significant advantage of the method of at least one of the disclosed embodiments of the present invention is that the etch properties of dielectric layers formed on semiconductor substrates can desirably be modified or tuned by using additive precursors in combination with the use of process control variables. The dielectric layers also can be formed at relatively low substrate temperatures and the film compositions can be controlled, thereby increasing productivity without the occurrence of thermal damage to the substrates, and expanding the types of applicable substrates. In addition, the method of at least one embodiment of the present invention can accurately control thickness, and can achieve high deposition rates, and form high conformal structures.

EXAMPLE 8

Second Precursor: Hexane

A dielectric layer was formed with the hydrogen containing Si precursor and the vaporized hydro-carbon precursor in same pulses duration under the condition shown below base on the sequence illustrated in FIG. 11A.
Trisilylamine: 100 sccm
Hydrogen: 500 sccm
Nitrogen: 50 sccm
Process helium: 1400 sccm
Sealed helium: 500 sccm
Argon: 1000 sccm
Substrate temperature: 400° C.
High frequency RF power (a frequency of 13.56 MHz): 0.07 W/cm$^2$
Low frequency RF power (a frequency of 430 kHz): 0.0 W/cm$^2$
Trisilylamine supply time: 0.3 sec supply, 3.0 sec supply stop
Hexane supply time: 0.3 sec supply, 3.0 sec supply stop The film thickness per cycle is approximately 1.17 A/cycle. The deposited dielectric film, Example 8, has wet etching rate 0.67 A/min. The etching test was carried out using a BHF130 etchant. The deposited film on the Si substrate was dipped in the etchant for 5 min, and then rinsed with de-ionized water. Film thickness was measured by an Ellipsometer.

EXAMPLE 9

Second Precursor: Hexane with Prolonged Pulse Duration

A dielectric layer was formed with the hydrogen containing Si precursor and the vaporized hydro-carbon precursor in different pulses duration (pulse duration of hydro-carbon precursor is 4 times longer than hydrogen containing Si precursor) under the condition shown below base on the sequence illustrated in FIG. 11B.
Trisilylamine: 100 sccm
Hydrogen: 500 sccm
Nitrogen: 50 sccm
Process helium: 1400 sccm
Sealed helium: 500 sccm
Argon: 1000 sccm
Substrate temperature: 400° C.
High frequency RF power (a frequency of 13.56 MHz): 0.07 W/cm$^2$
Low frequency RF power (a frequency of 430 kHz): 0.0 W/cm$^2$
Trisilylamine supply time: 0.3 sec supply, 3.0 sec supply stop
Hexane supply time: 1.2 sec supply, 2.1 sec supply stop In case of Example 9, the film thickness per cycle is approximately 1.32 A/cycle. The deposited dielectric film (Example 9) has wet etch rate approximately 0.2 A/min under BHF130 etchant.

EXAMPLE 10

Second Precursor: Hexane with Prolonged Pulse Duration

A dielectric layer was formed with the hydrogen containing Si precursor and the vaporized hydro-carbon precursor in different pulses duration (pulse duration of hydro-carbon precursor is 8 times longer than hydrogen containing Si precursor) under the condition shown below base on the sequence illustrated in FIG. 11C.
Trisilylamine: 100 sccm
Hydrogen: 500 sccm
Nitrogen: 50 sccm
Process helium: 1400 sccm
Sealed helium: 500 sccm
Argon: 1000 sccm
Substrate temperature: 400° C.
High frequency RF power (a frequency of 13.56 MHz): 0.07 W/cm$^2$
Low frequency RF power (a frequency of 430 kHz): 0.0 W/cm$^2$
Trisilylamine supply time: 0.3 sec supply, 3.0 sec supply stop
Hexane supply time: 2.4 sec supply, 0.9 sec supply stop In case of Example 10, the film thickness per cycle is approximately 1.55 A/cycle. The deposited dielectric film (Example 10) has wet etch rate almost 0.0 A/min under BHF130 etchant.

FIG. 12 shows the comparison of IR absorption spectra with Example 8, Example 9, and Example 10, wherein the —CHx peak appears in a range of 3000~2840 cm-1, the —NH peak appears in range of 1600~1320 cm$^{-1}$, and C—N peak appears in 1250 cm-1 with increasing hexane supply time.

Figure 14:
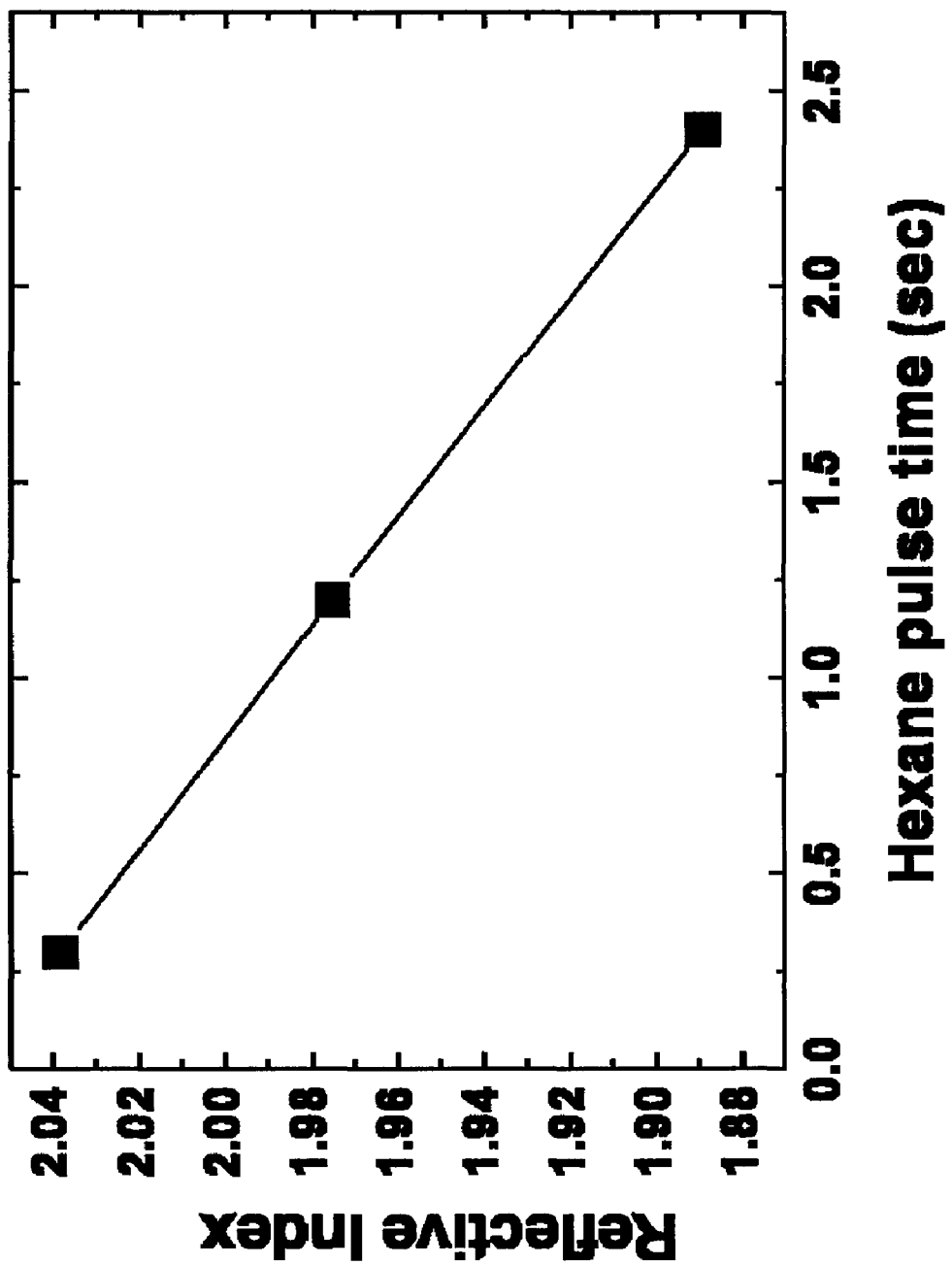
FIG. 14 is a graph showing the relationship between hexane supply duration (sec) and reflective index according to an embodiment of the present invention.
Figure 15:
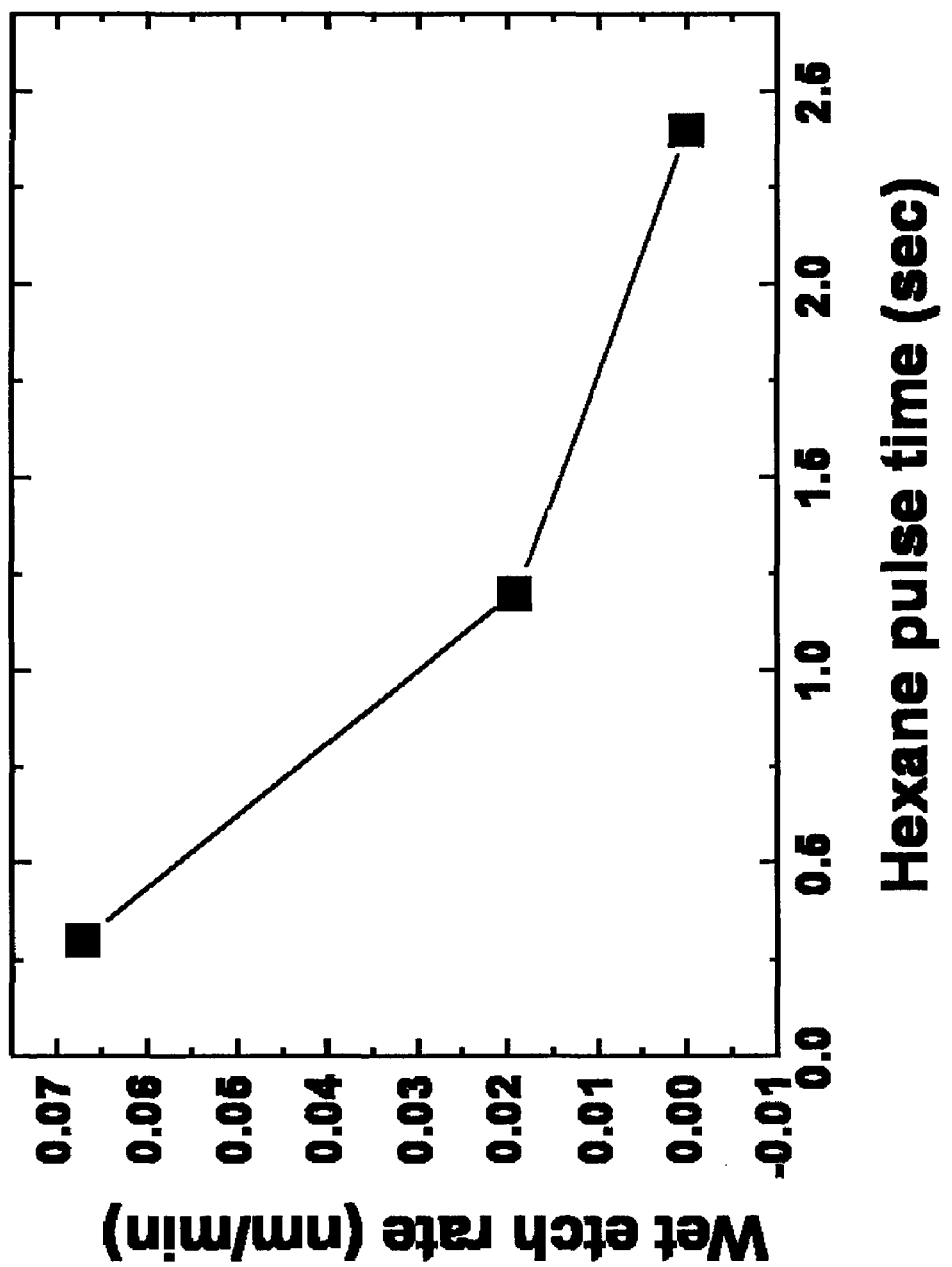
FIG. 15 is a graph showing the relationship between hexane supply duration (sec) and wet etching rate (nm/min) according to an embodiment of the present invention.

Table 3 shows the change of wet etch resistance and reflective index under various process conditions. Process conditions correspond to those indicated in Examples 8-10. By varying the process conditions, wet etch resistance and reflective index of deposited film has been altered (FIGS. 14 and 15). According to the Table 4, wet etching resistance is increased with n-hexane supply time and reflective index is decreased with increasing n-hexane supply time (FIG. 16).

TABLE 3

Wet etching rate and reflective index change under various process conditions

| Si-precursor | —CxHy precursor | RF power | Precursor supply (TSA/n-Hexane) | WER (nm/min) | R.I. (@633 nm) |
|---|---|---|---|---|---|
| Trisilylamin | n-Hexane | 0.07 W/cm$^2$ | 0.3 sec/0.3 sec | 0.067 | 2.038 |
| | | | 0.3 sec/1.2 sec | 0.019 | 1.975 |
| | | | 0.3 sec/2.4 sec | No damage | 1.889 |

Figure 13:
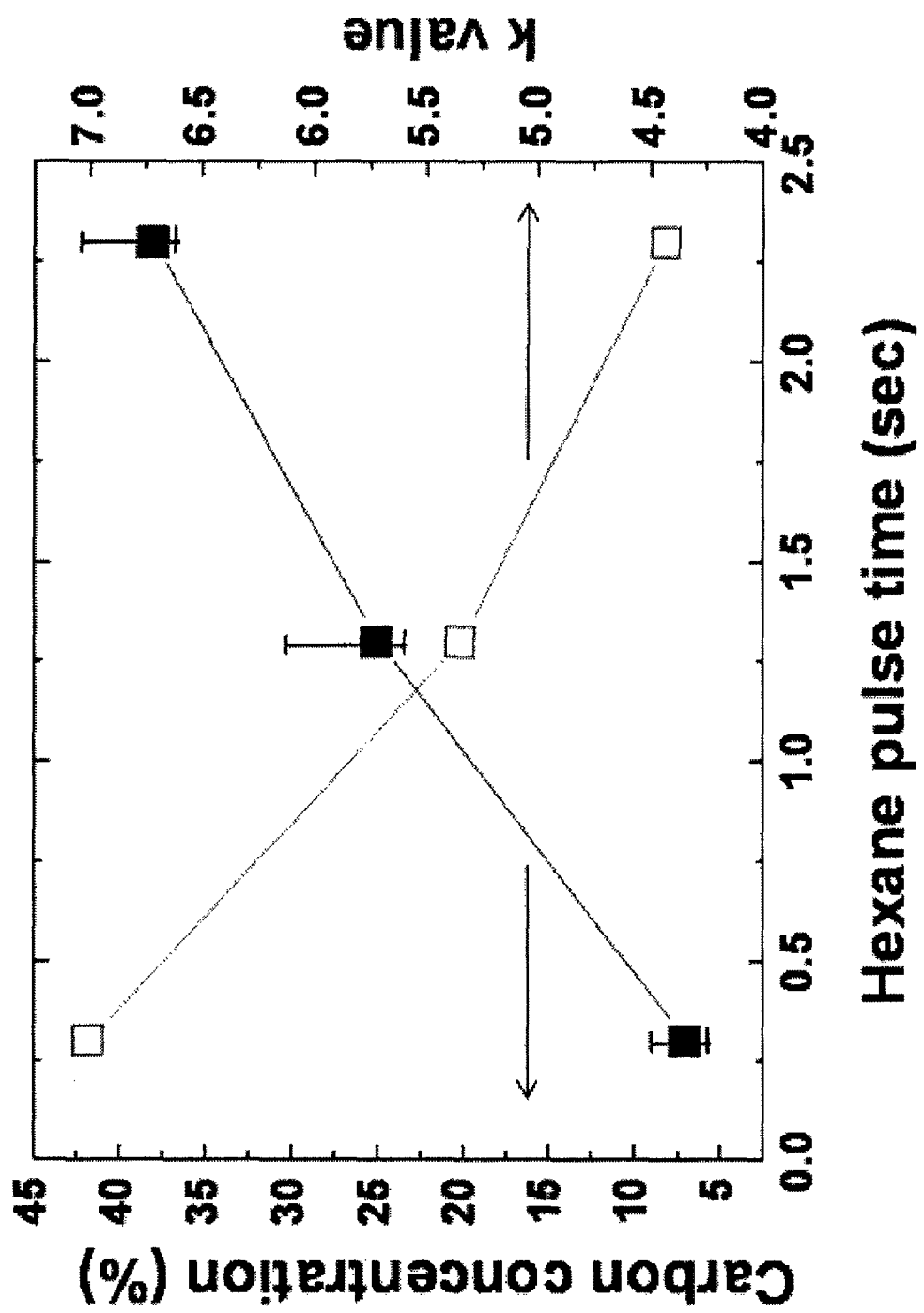
FIG. 13 is a graph showing the relationship between hexane supply duration (sec) and carbon concentration (%) and also dielectric constant (k-value) according to an embodiment of the present invention.

FIG. 13 shows the carbon concentration in the deposited film and their k-value with n-hexane supply time. Amount of carbon is increased from around 6% to around 40% with n-hexane supply time. Also, k-value is decreased from around 7 to around 4.5 as same above. These indicate it is possible to control the amount of carbon in dielectric layers with varying supply time. Amount of carbon was detected by RBS/HFS measurement. Table 4 shows the k-value change after heat treatment up to 800° C. In case of Example 8, k-value of as-deposition and after heat treatment is 7.0 and 6.9. In case of Example 9, k-value of as-deposition and after heat treatment is 5.3 and 4.9. In case of Example 10, k-value of as-deposition and after heat treatment is 4.4 and 5.2.

TABLE 4 k-value change heat treatment

| Si-precursor | —CxHy precursor | RF power | Precursor supply (TSA/n-Hexane) | as-deposition k-value | After ANL k-value |
|---|---|---|---|---|---|
| Trisilylamin | n-Hexane | 0.07 W/cm$^2$ | 0.3 sec/0.3 sec | 7.0 | 6.9 |
| | | | 0.3 sec/1.2 sec | 5.3 | 4.9 |
| | | | 0.3 sec/2.4 sec | 4.4 | 5.2 |

A significant advantage of the method of at least one of the disclosed embodiments of the present invention is that k-value modified dielectric layers can be formed on semiconductor substrates with varying additive precursors supply time. The dielectric layers also can be formed at relatively low substrate temperatures and can be controlled the film composition, thereby increasing productivity without the occurrence of thermal damage to the substrate, and expanding the types of applicable substrates. In addition, the method of an embodiment of the present invention can control thickness exactly, and achieve high deposition rate, and can achieve high conformal structure.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method of forming a conformal dielectric film having Si—N bonds on a semiconductor substrate by plasma enhanced chemical vapor deposition (PECVD), which comprises:
   introducing a nitrogen- and/or hydrogen-containing reactive gas and a rare gas into a reaction space inside which the semiconductor substrate is placed;
   applying RF power to the reaction space; and
   introducing a hydrogen-containing silicon gas as a first precursor and a hydrocarbon gas as a second precursor separately, each precursor being introduced in pulses of less than 5-second duration into the reaction space while introducing the reactive gas and the rare gas and exciting a plasma without interruption, thereby forming a conformal dielectric film having Si—N bonds on the substrate.

2. The method according to claim 1, wherein the first precursor has a formula of $Si_\alpha H_\beta X_\gamma$, wherein $\alpha$, $\beta$ and $\gamma$ are integers ($\gamma$ includes zero), wherein X comprises N, F and/or $C_m H_n$, wherein m and n are integers.

3. The method according to claim 1, wherein the first precursor is a liquid at room temperature and vaporized upstream of the reaction space.

4. The method according to claim 1, wherein the first precursor is introduced in pulses while the reactive gas and the rare gas are continuously introduced and the RF power is continuously applied.

5. The method according to claim 1, wherein the pulse duration of the first precursor is equal to or shorter than the interval between pulses.

6. The method according to claim 5, wherein the first precursor is introduced in pulses of a duration of approximately 0.1 sec to 1.0 sec with an interval between pulses of approximately 0.1 sec to 3.0 sec.

7. The method according to claim 1, wherein the rare gas comprises at least one of a mixture of $N_2$ and $H_2$, a mixture of $NH_3$ and $H_2$, and a nitrogen-boron-hydrogen gas.

8. The method according to claim 1, wherein the rare gas comprises a mixture of helium and argon or a mixture of helium and krypton.

9. The method according to claim 1, wherein the conformal dielectric film is a carbon-doped silicon nitride film having a carbon concentration of about 5% to about 40% and a conformality of about 80% or higher.

10. The method according to claim 1, wherein the first precursor has no carbon atom in its molecule, and the second precursor has no silicon atom in its molecule.

11. The method according to claim 10, wherein the first precursor and the second precursor are introduced in pulses having the same cycle.

12. The method according to claim 10, wherein the first precursor and the second precursor are introduced in pulses having different cycles, wherein more than one cycle of the second precursor is performed per one cycle of the first precursor.

13. The method according to claim 11, wherein the pulse duration of the second precursor is one to ten times longer than that of the first precursor.

14. The method according to claim 1, wherein the second precursor is selected from the group consisting of $CH_4$, $C_2H_6$, $C_5H_{12}$, and $C_6H_{14}$.

15. The method according to claim 1, wherein the gases introduced into the reaction space consist of the first precursor, the second precursor, the reactive gas, and the rare gas.

16. A method of forming a conformal dielectric film having Si—N bonds on a semiconductor substrate by plasma enhanced chemical vapor deposition (PECVD), which comprises:

introducing a nitrogen- and/or hydrogen-containing reactive gas and a rare gas into a reaction space inside which the semiconductor substrate is placed;

applying RF power to the reaction space; and introducing a hydrogen-containing silicon gas as a first precursor and a hydrocarbon gas as a second precursor separately, each precursor being introduced in pulses of less than 5-second duration into the reaction space while introducing the reactive gas and the rare gas and exciting a plasma without interruption, thereby forming a conformal dielectric film having Si—N bonds on the substrate; and after forming the conformal dielectric film as a first conformal dielectric film, increasing the pulse duration of the second precursor per cycle without changing the length of one cycle which is the same as that for the first precursor, or performing multiple cycles of the second precursor per one cycle of the first precursor, thereby forming a second conformal dielectric film which has a carbon concentration higher than that of the first conformal dielectric film.

17. A method of forming dielectric films having Si—N bonds on a semiconductor substrate by plasma enhanced chemical vapor deposition (PECVD), which comprises:

(i) introducing a nitrogen- and/or hydrogen-containing reactive gas and an rare gas into a reaction space inside which the semiconductor substrate is placed;

(ii) applying RF power to the reaction space;

(iii) introducing as a first precursor a hydrogen-containing silicon gas in pulses of less than a 5-second duration into the reaction space while introducing the reactive gas and the inert gas and exciting a plasma without interruption, thereby forming a first dielectric film having Si—N bonds on the substrate; and (iv) forming a second dielectric film having Si—N bonds on the substrate by repeating steps (i) to (iii), wherein step (iii) further comprises introducing a second precursor in pulses while introducing the first precursor in pulses at the same timing, thereby increasing wet etching resistance of the second dielectric film as compared with that of the first dielectric film, said second precursor being a hydrocarbon gas containing no silicon.

18. The method according to claim 17, wherein step (iv) further comprises prolonging the pulse duration of the second precursor relative to that of the first precursor.

19. The method according to claim 18, wherein the pulse duration of the second precursor is at least four times longer than that of the first precursor.

20. The method according to claim 17, wherein step (iv) further comprises reducing nitrogen gas flow relative to that for the first dielectric film, and/or increasing the number of cycles of the second precursor per cycle of the first precursor.

* * * * *